(12) United States Patent
Funaki

(10) Patent No.: US 7,176,569 B2
(45) Date of Patent: Feb. 13, 2007

(54) SEMICONDUCTOR DEVICE AND METHOD OF MANUFACTURING THE SAME

(75) Inventor: Tsukio Funaki, Ebina (JP)

(73) Assignees: Renesas Technology Corp., Tokyo (JP); Renesas Eastern Japan Semiconductor, Inc., Tokyo (JP)

( * ) Notice: Subject to any disclaimer, the term of this patent is extended or adjusted under 35 U.S.C. 154(b) by 274 days.

(21) Appl. No.: 10/762,315

(22) Filed: Jan. 23, 2004

(65) Prior Publication Data

US 2004/0159958 A1    Aug. 19, 2004

(30) Foreign Application Priority Data

Feb. 14, 2003    (JP) .............................. 2003-036045

(51) Int. Cl.
*H01L 23/48* (2006.01)
(52) U.S. Cl. ...................... 257/737; 257/758; 257/678
(58) Field of Classification Search ................ 257/780, 257/737, 738, 701, 702, 678
See application file for complete search history.

(56) References Cited

U.S. PATENT DOCUMENTS

| 6,492,737 | B1* | 12/2002 | Imasu et al. ................. 257/778 |
| 2001/0027007 | A1* | 10/2001 | Hosomi et al. ............. 438/611 |
| 2002/0132463 | A1* | 9/2002 | Urushima .................... 438/613 |
| 2005/0167808 | A1* | 8/2005 | Sasaki et al. ................ 257/678 |

FOREIGN PATENT DOCUMENTS

| JP | 2001-231770 | 8/2001 |
| WO | WO 03/012863 | 2/2003 |

\* cited by examiner

*Primary Examiner*—Douglas W. Owens
(74) *Attorney, Agent, or Firm*—Miles & Stockbridge P.C.

(57) ABSTRACT

Provided is a semiconductor device having a semiconductor chip mounted over a substrate, in which an interconnect is formed, by using an adhesive layer to permit contact conduction between a stud bump of the semiconductor chip and an interconnect of a tape substrate, wherein an adhesive layer formed integral as a film is adhered to each block made of substrates corresponding to a plurality of semiconductor devices and contact bonding under heat is conducted. The adhesive layer corresponding to the plurality of semiconductor devices is thus formed continuously and with this adhesive layer, the interconnect formation surface at the end portion of the substrate is covered. Moreover, with a thermosetting resin used as the adhesive layer, the semiconductor chip and substrate are adhered by contact bonding under heat while placing the substrate on a rigid heat insulating plate. According to the present invention, heat diffusion and deformation of the substrate upon contact bonding under heat can be prevented by the rigid heat insulating plate. Upon dicing, the peeling of the interconnect from the substrate can be prevented by holding the interconnect with the adhesive layer at the end portion of the substrate.

2 Claims, 21 Drawing Sheets

SEMICONDUCTOR DEVICE AND METHOD OF MANUFACTURING THE SAME

BACKGROUND OF THE INVENITON

The present invention relates to a semiconductor device and a manufacturing method thereof, particularly to a technique effective when applied to a semiconductor device having a semiconductor chip and a substrate connected via a stud bump.

In semiconductor devices, as miniaturization of semiconductor chips proceeds, the number of circuits to be mounted on one semiconductor chip is increasing. For such highly integrated circuits, semiconductor devices need a larger number of connecting terminals. For example, with advance in miniaturization, semiconductor memory devices have a higher capacity and has a bus width enlarged enough to process a large capacity of data at high speed, which require more connecting terminals.

To cope with such an increase in the number of connecting terminals, BGA (Ball Grid Array) type semiconductor devices adopt C4 connection (controlled Collapse Chip Connection) in which ball- or column-shaped bump electrodes using a solder and disposed horizontally on a surface on which a semiconductor device is to be mounted are connected simultaneously by vitrification of the bump electrodes 5 to a mounting substrate having connecting terminals formed thereover to correspond to the terminal disposal on the semiconductor device. The semiconductor device is connected to the mounting substrate by reflow soldering, that is, by heating the substrate by hot air blowing or infrared ray irradiation to melt the solder of the bump electrode and connect the bump electrode of the semiconductor device to the terminal of the mounting substrate, and then solidifying the solder by lowering the temperature.

Moreover, to meet a tendency to size and thickness reduction of an electronic device to be mounted, semiconductor devices are requested to have a smaller and thinner product size. Various types of semiconductor devices are considered as a CSP (Chip Size Package) semiconductor device in which the outside dimension of the product is made substantially equal to that of a semiconductor chip to be mounted.

A semiconductor device using a tape substrate is one of CSP. In this semiconductor device, a semiconductor chip is mounted on one side of a tape substrate having interconnects made of a metal film such as copper formed over a base made of an insulating resin such as polyimide; a bump electrode which will serve as an external terminal of the semiconductor device and is used for the connection with a mounting substrate is formed on the other side; and the semiconductor chip is connected with one end of the interconnect formed over the tape substrate and the bump electrode is connected to the other end.

Such a connection between the semiconductor chip and interconnect by using the bump electrode enables a reduction in inductance and in turn, speedup of signal processing, compared with the conventionally and popularly used connection by wire bonding. This also actualizes size and thickness reduction of the semiconductor device as a product.

Formation of bump electrodes using a solder is accompanied by an increase in the number of steps and a cost rise, because a solder paste is printed and adhered to a pad 12 through a mask, the solder thus adhered is melted by reflow and then, the residue such as flux is removed by washing. In addition, when a semiconductor chip and a substrate are connected via a solder, the melting point of the solder used for connecting the semiconductor chip with the substrate is set higher than that of another solder used for connecting a tape substrate and a mounting substrate, which inevitably limits materials used for these solders.

To overcome the above-described problem, a stud bump is considered as a measure for facilitating the formation of bump electrodes by making use of a wire bonding technique. In the formation of a stud bump, a gold wire having a diameter as fine as from about 20 μm to 30 μm and exposed from a wire bonder capillary is melted by using a discharge torch or the like. The molten gold becomes a sphere having a diameter of about 50 μm to 80 μm by surface tension. While the resulting gold ball is bonded onto the pad 12 of the semiconductor chip 4, the capillary is detached without reeling out a wire. The gold ball portion is separated from the capillary and a protruding electrode is formed on the pad 12.

In this stud bump, the spherical portion fixed onto the pad 12 has a diameter of from about 60 μm to 90 μm and a height of about 70 μm. Since the gold wire is drawn and the diameter of the wire decreased gradually upon separation, a conical protrusion is formed on the sphere.

In the connection between this stud bump and the tape substrate, the semiconductor chip is fixed by adhesion to the substrate with an adhesive layer such as NCF (Non Conductive Film) which is a film adhesive while pressing the semiconductor chip towards the substrate. The contact conduction is thereafter maintained between the stud bump and the connection terminal on the substrate.

SUMMARY OF THE INVENTION

A technique on CSP having a semiconductor chip mounted on a tape substrate is described in Japanese Patent Application No. 2001-231770.

During the manufacture of the semiconductor device disclosed herein, a plurality of tape substrates of the semiconductor device are integrally formed as a strip-shaped sheet or a film wound on a reel. After the semiconductor chip is mounted on each tape substrate, the tape substrate is cut and separated into pieces. According to the above-described patent document, a tape base material 10 is disposed between an interconnect 11 of a tape substrate 3 and a semiconductor chip 2, whereby a gold wire bump electrode 20 and an interconnect 22 are connected inside of an opening groove 14 formed in the tape base material 10.

With high integration and function increase of semiconductor chips in recent days, the integration density of pads which will serve as external terminals of a chip increases, leading to downsizing of the pads. The planar layout size of a protruding electrode which can be formed on the pad becomes smaller with a size reduction in the pad. Since a height/width ratio of the protruding electrode is limited by the manufacturing method of the protruding electrode, the height of it gradually decreases with a size reduction of the planar layout of the protruding electrode.

When a protruding electrode having a height lowered with a trend of a semiconductor chip toward high integration is applied to a semiconductor device as described above in which an electrode and an interconnect are connected inside of an opening groove formed in a tape base material, the height of the protruding electrode is not sufficient relative to the depth of the opening groove formed in the tape base material and sometimes causes connection failure between the protruding electrode and interconnect. The present inventors have independently carried out an investigation on this problem.

An object of the present is to provide a technique capable of overcoming the above-described problems and preventing connection failure between a semiconductor chip and an interconnect of a substrate.

The above-described and the other objects and novel features of the present invention will be apparent by the description herein and accompanying drawings.

The typical inventions, among the inventions disclosed by the present application, will next be descried briefly.

In a semiconductor device having a semiconductor chip mounted over a substrate, in which an interconnect is formed, by using an adhesive layer to permit contact conduction between a stud bump of the semiconductor chip and an interconnect of a tape substrate, another stud bump is stacked over the stud bump to form a multistage stud bump structure.

In a semiconductor device having a semiconductor chip mounted over a substrate, in which an interconnect is formed, by using an adhesive layer to permit contact conduction between a stud bump of the semiconductor chip and an interconnect of a tape substrate, a stress between the semiconductor chip and the substrate is relaxed by thinning the adhesive layer.

In a semiconductor device having a semiconductor chip mounted over a substrate, in which an interconnect is formed, by using an adhesive layer to permit contact conduction between a stud bump of the semiconductor chip and an interconnect of a tape substrate, an interconnect formation surface at the end portion of the substrate is covered with the adhesive layer.

In a semiconductor device having a semiconductor chip mounted over a substrate, in which an interconnect is formed, by using an adhesive layer to connect a stud bump of the semiconductor chip to one end of the interconnect and an external terminal of the semiconductor device to the other end of the interconnect, a common interconnect is disposed along the periphery of the substrate and the number of stud bumps to be connected to this common interconnect is made greater than that of the external terminals to be connected to this common interconnect.

In a semiconductor device having a semiconductor chip mounted over a substrate, in which an interconnect is formed, by using an adhesive layer to connect a stud bump of the semiconductor chip to one end of the interconnect and an external terminal of the semiconductor device to the other end of the interconnect, a bump electrode which will be an external terminal is formed, via a pad, at the other end of the interconnect and this pad is formed to have sufficient thickness.

A manufacturing method of a semiconductor device comprising a step of mounting a semiconductor chip over a substrate, in which an interconnect is formed, by using an adhesive layer to permit contact conduction between a stud bump of the semiconductor chip and an interconnect of a tape substrate, which further comprises:

a step of using a thermosetting resin as the adhesive layer and adhering the semiconductor chip and the substrate by contact molding under heat while having the substrate placed on a rigid heat insulating plate.

A manufacturing method of a semiconductor device comprising a step of mounting a semiconductor chip over a substrate, in which an interconnect is formed, by using an adhesive layer to permit contact conduction between a stud bump of the semiconductor chip and an interconnect of a tape substrate, which further comprises:

a step of adhering an adhesive layer, which is integrally formed as a film, to each block formed of a plurality of the substrates corresponding to a plurality of the semiconductor devices.

The above-described integrally formed adhesive layer of each block is subjected to contact bonding under heat to continuously form the adhesive layer corresponding to a plurality of semiconductor devices.

In the present invention as described above, the rigid insulating plate makes it possible to prevent heat diffusion and at the same time, prevent the deformation of the substrate upon contact bonding under heat. In addition, upon dicing, the interconnect is held by the adhesive layer at the end portion of the substrate to prevent the interconnect from peeling from the substrate.

DETAILED DESCRIPTION OF THE INVENTION

Figure 1:
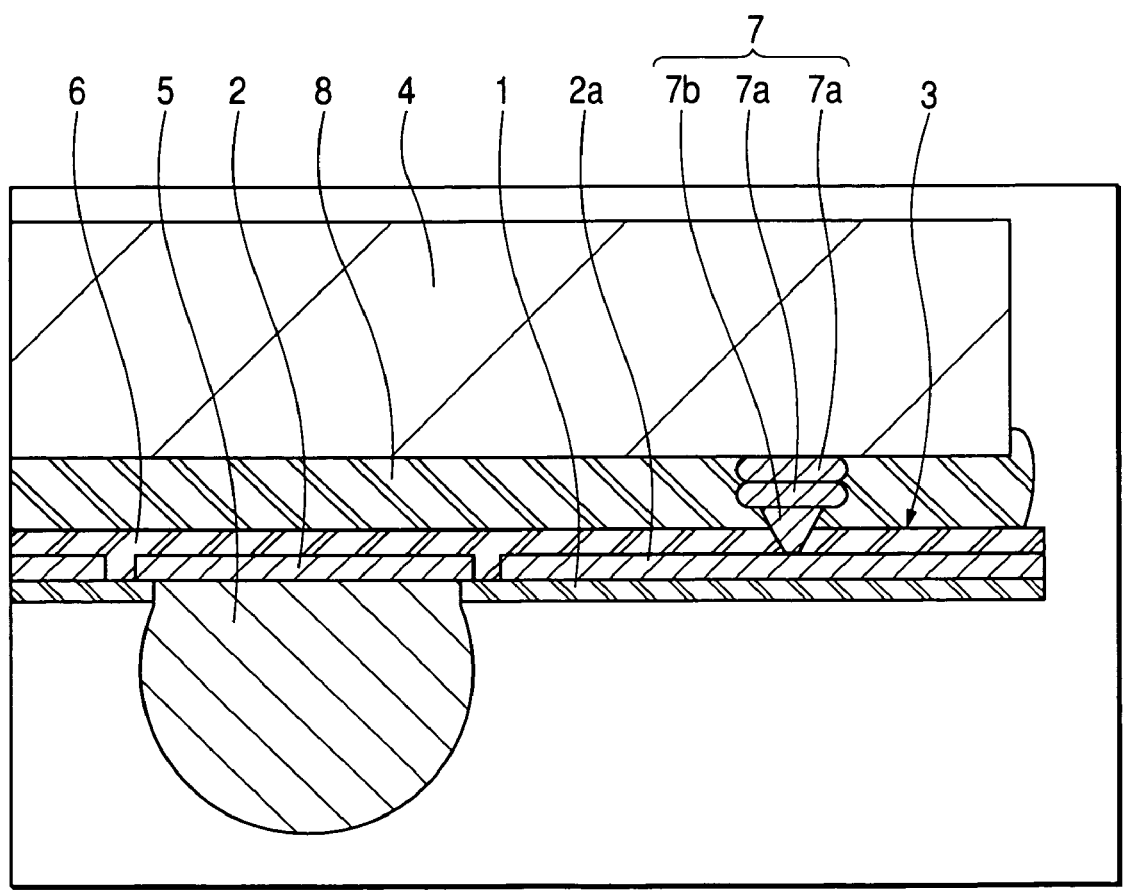
FIG. 1 is a fragmentary longitudinal cross-sectional view of a semiconductor device according to one embodiment of the present invention.

The embodiments of the present invention will next be described.

In all the drawings for describing the embodiments, like members of a function will be identified by like reference numerals and overlapping descriptions will be omitted.

FIG. 1 is a fragmentary longitudinal cross-sectional view of a semiconductor device according to one embodiment of the present invention.

In the semiconductor device of this embodiment, a semiconductor chip 4 is mounted on one side of a tape substrate 3 having an interconnect 2 made of a metal film such as copper formed over a base 1 which is a flexible film made of an insulating resin such as epoxy resin, aramid resin or polyimide resin; and a bump electrode 5 such as solder, which will serve as an external terminal of the semiconductor device and is used for connecting with a mounting substrate, is formed over the other side. The semiconductor chip 4 is connected to one end of the interconnect 2 formed over the tape substrate 3, while the bump electrode 5 is connected to the other end. In order to prevent short-circuit failure of this interconnect 2, a solder resist 6 is applied as an insulating coating to only a portion of the interconnect 2 necessary for connection.

For the connection between the semiconductor chip 4 and interconnect 2, a stud bump 7 is employed. This stud bump 7 is formed of a spherical portion 7a to be fusion bonded to a pad 12 of the semiconductor chip 4, and a conical protruding portion 7b associated with the spherical portion 7a. The semiconductor chip 4 and the tape substrate 3 are fixed by adhesion with an adhesive layer 8 such as NCF (Non Conductive Film) which is an insulating film adhesive while the semiconductor chip 4 is pressed against the tape substrate 3 to bring the protruding portion 7b of the stud bump 7 into contact with the interconnect 2 of the tape substrate 3. The contact conduction is thus attained between stud bump 7 of the semiconductor chip 4 and the interconnect 2 of the tape substrate 3.

In the tape substrate 3 of this embodiment, the interconnect 2 is formed only on the semiconductor-chip-mounting side of the base 1. In addition, the bump electrode 5 attached to the other side of the base 1 is connected to the interconnect 2 via a hole made in the base 1. This structure does not need a via-hole interconnect penetrating through the base 1 so that the cost of the tape substrate 3 can be reduced.

When the diameter of the bump decreases with the narrowing of the pitch and sufficient bump height or bump height necessary for the thickness of the solder resist cannot be maintained, the main surface of the chip happens to be brought into contact with the solder resist and conduction between the bump and interconnect is sometimes disturbed. To overcome this problem, the stud bump 7 must be made higher. An increase in the height of the stud bump 7 requires an increase in the diameter of the stud bump 7. This increase in the diameter of the stud bump 7 inevitably widens the arrangement pitch of the stud bump 7. As illustrated in FIG. 1, by stacking, over the stud bump 7 already formed over the semiconductor chip 4, another stud bump 7, and thereby forming a multistage bump, the stud bump 7 has a sufficient height without increasing the diameter of the stud bump 7.

Usually in the connection using the stud bump 7, the semiconductor chip 4 and the tape substrate 3 are fixed by an adhesive force of the adhesive layer 8 while a pressure is applied to the semiconductor chip 4. By a repulsive force of the interconnect 2 against the pushing power of the stud pad 7, the contact conduction is maintained between the semiconductor chip 4 and interconnect 2. When the semiconductor chip 4 is mounted on the flexible tape substrate 3, however, it is sometimes difficult to maintain contact conduction between the semiconductor chip 4 and the interconnect 2 of the tape substrate 3, because flexibility disturbs the interconnect 2 from exhibiting the repulsive force.

The stud bump 7 and interconnect 2 are fixed by the adhesive force of the adhesive layer 8, whereby the contact conduction can be kept. When deformation of the stud bump 7 and adhesive layer 8 occurs owing to, for example, thermal expansion and a relative positional relationship between them undergoes a change, the stud bump 7 is not always brought into contact with the interconnect 2. In order to avoid such a situation, the thickness of the adhesive layer 8 and the height of the stud bump 7 are desirably reduced.

When thermal expansion occurs, their shapes change in proportion to temperature. Their changing amounts are proportionate to the thickness of the adhesive layer 8 and height of the stud bump 7, respectively. In order to lessen the deformation amount, a reduction in each of the thickness of the adhesive layer 8 and the height of the stud bump 7 is desired.

Figure 2:
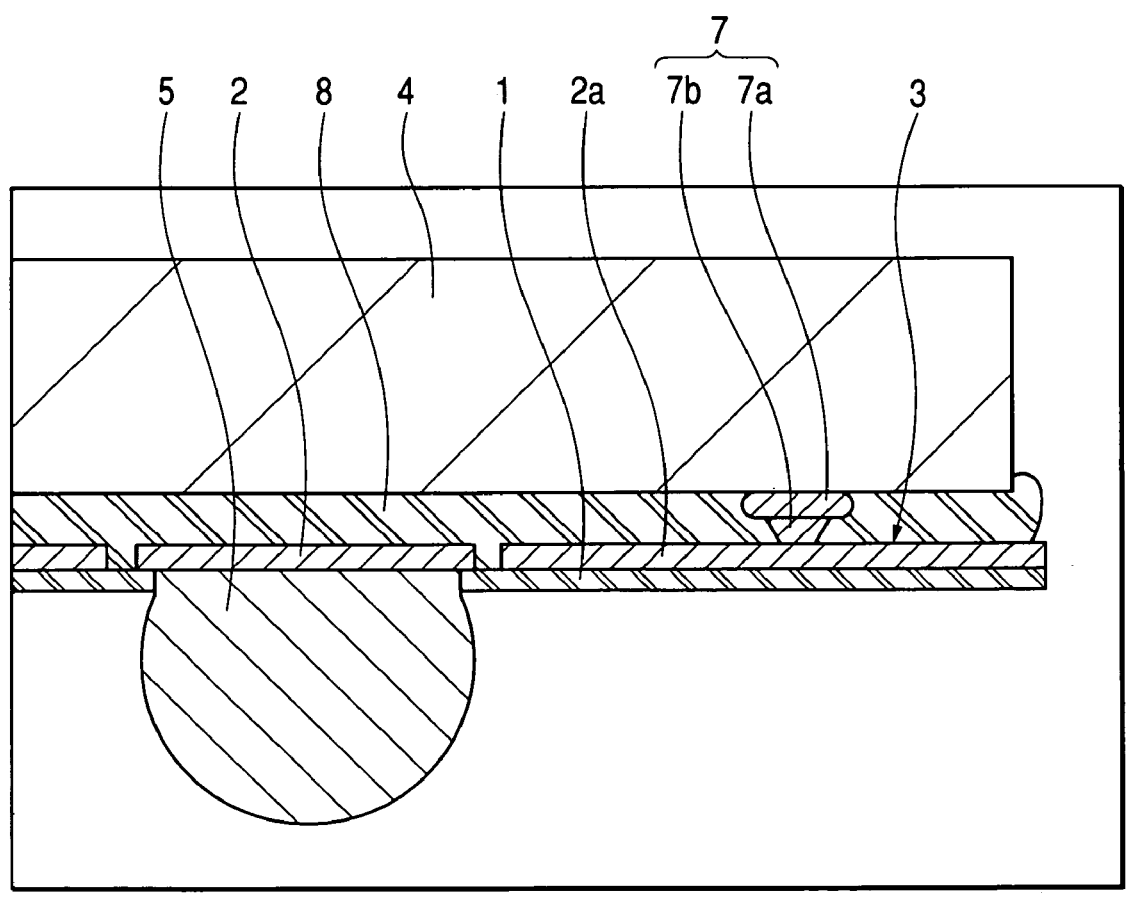
FIG. 2 is a fragmentary longitudinal cross-sectional view of a semiconductor device according to the one embodiment of the present invention.

In a semiconductor device illustrated in the fragmentary longitudinal cross-sectional view of FIG. 2, the thickness of the adhesive layer 8 is reduced to about 10 μm from the ordinary thickness of about 20 μm and, according to this reduction, the stud bump 7 is lowered. In addition, the height of the stud bump 7 is decreased further by omitting the solder resist 6 for covering the interconnect 2 and, thereby reducing the height of the stud bump 7 by a height corresponding to the thickness of the solder resist 6. This makes it possible to decrease the deformation amount of the stud bump 7 and improve the connection reliability between the stud bump 7 and interconnect 2. On the semiconductor chip 4, an NC pad 12 which is disposed for a test purpose and is not connected in the form of a finished product is formed as well as the ordinary pad 12, but the interconnect 2 is covered with the insulating adhesive layer 8 after mounting of the semiconductor chip 4 so that no short-circuit occurs between the NC pad 12 and interconnect 12 even without provision of the solder resist 6.

The adhesion between the semiconductor chip 4 and the tape substrate 3 was evaluated by the present inventors by placing the tape substrate 3 on a table made of a metal such as stainless and using a heat block 14 to heat and pressurize the chip and substrate to adhere them. In this case, owing to high heat conductivity of the table, the heat of the heat block 14 diffuses from the table and heating efficiency lowers. The present inventors therefore, as illustrated in a fragmentary longitudinal cross-sectional view of FIG. 3, tried to heat them after laying, over the table, a heat insulating plate 10 made of a resin. As a result of evaluation, the inventors have found that a plating interconnect of the base substrate happens to be brought into contact with the end portion of the semiconductor chip 4.

For the formation of the interconnect 2 on the base substrate, electroplating is often employed because of its high film forming rate, good film quality and high freedom of selection of a plating solution. In the case of a base substrate having the interconnect 2 formed thereon by electroplating, each interconnect 2 is electrically connected and integrally formed with a lead interconnect 2a, whereby a potential is fed to each interconnect 2 upon plating. Since upon segmenting of the semiconductor device, the lead interconnect 2a of each semiconductor device is separated by dicing so that this lead interconnect 2a extends to the end portion of the base substrate.

Figure 3:
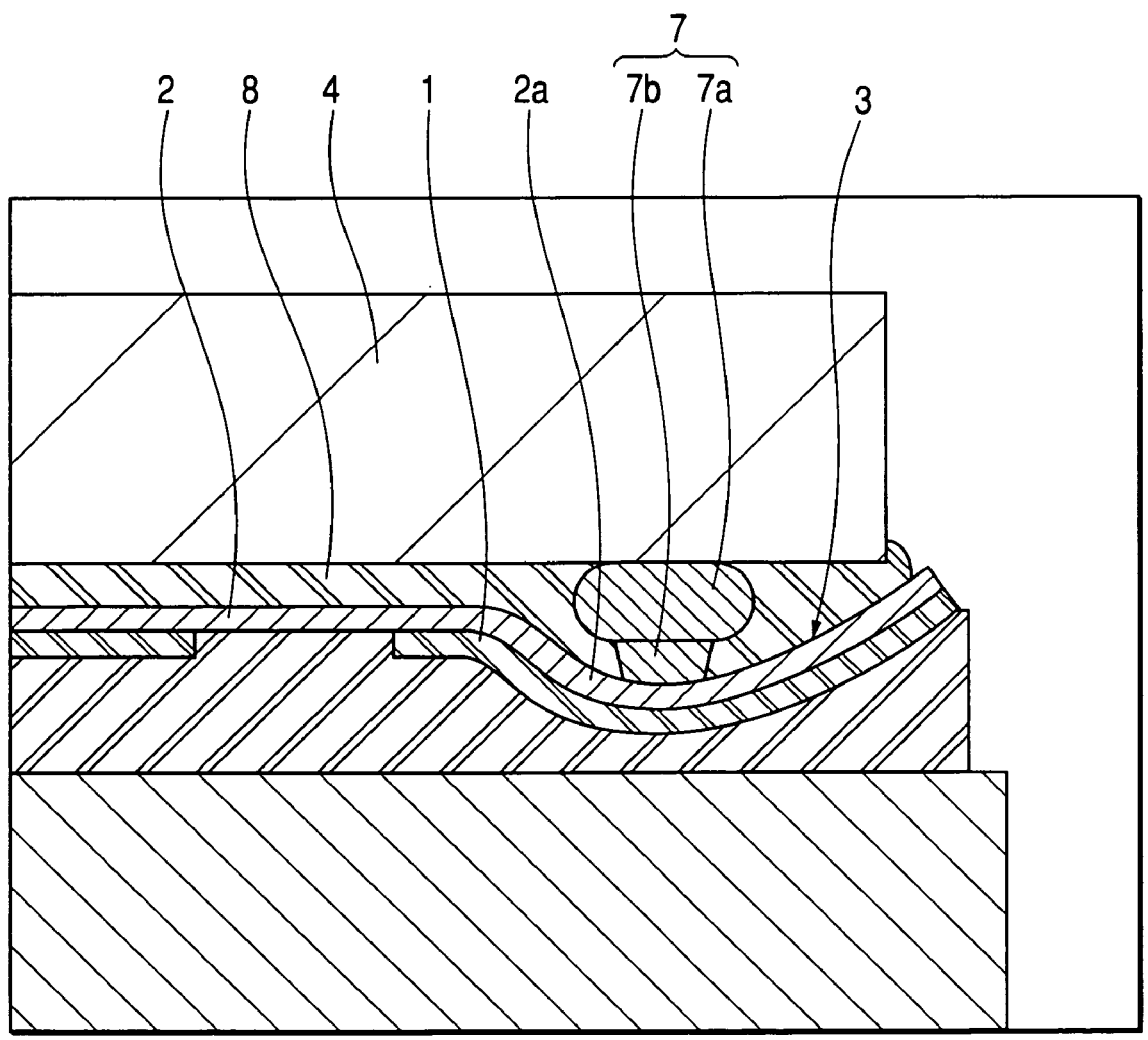
FIG. 3 is a fragmentary longitudinal cross-sectional view of a manufacturing step of a conventional semiconductor device.

In the above-described trial, deformation of the heat insulating plate 10 occurs upon contact bonding under heat. The tape substrate 3 is then forced into the insulating plate 10 at the stud bump 7 on which a force is applied, and as illustrated in FIG. 3, the tape substrate 3 changes its shape and the lead interconnect 2a declines at the end portion of the tape substrate 3 and happens to get touch with the semiconductor chip 4.

Figure 4:
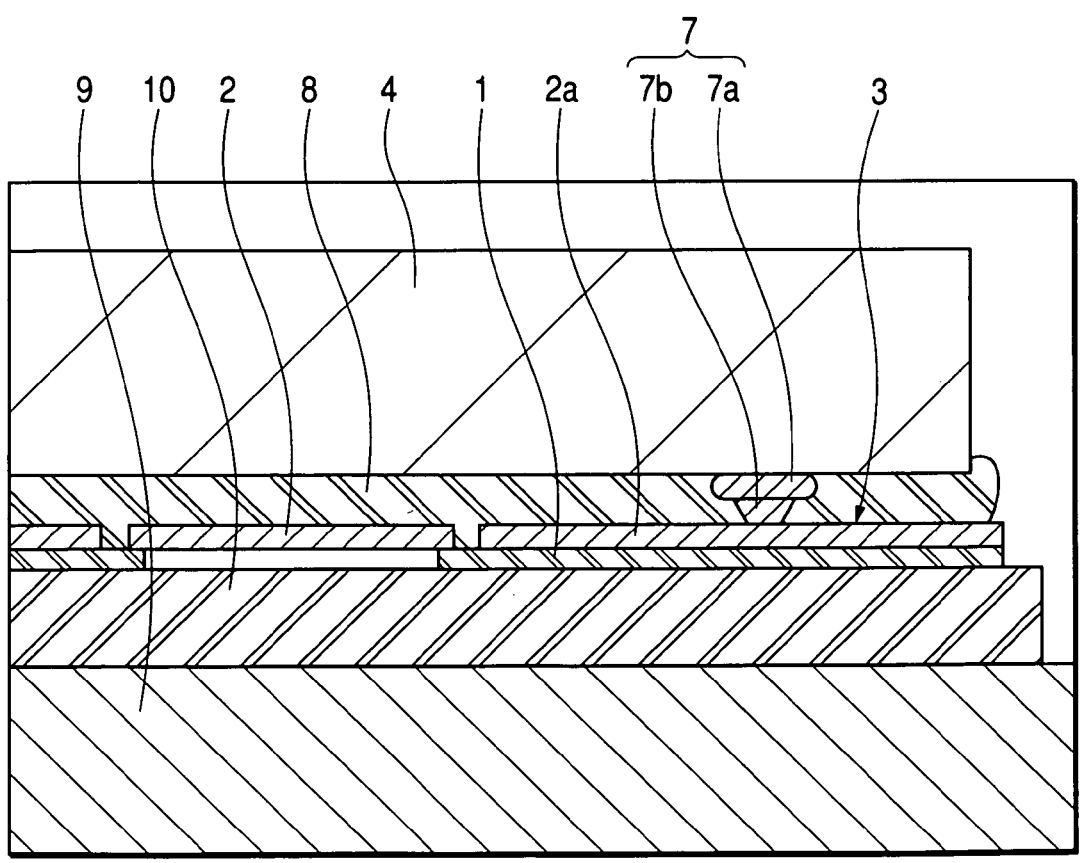
FIG. 4 is a fragmentary longitudinal cross-sectional view illustrating a manufacturing step of the semiconductor device according to the one embodiment of the present invention.

In this embodiment, for the purpose of overcoming the above-described problem, contact bonding under heat is carried out while having the tape substrate 3 placed on a rigid heat insulating plate 10 made of glass or ceramic as illustrated in the fragmentary longitudinal cross-sectional view of FIG. 4. When this rigid heat insulating plate 10 is used, the deformation of the tape substrate 3 upon contact bonding under heat can be prevented. The interconnect 2 can therefore be fixed in substantially parallel to the semiconductor chip 4 and there does not occur contact of the end portion of the interconnect 2 with the semiconductor chip 4. In this embodiment, a description is made on the heat insulating plate 10 made of glass or ceramic, but the material of the heat insulating plate is not limited to the above one and any material is usable insofar as it has a sufficiently high rigidity. In particular, the heat insulating plate is preferably made of a material having a higher rigidity than that of the stud bump 7. When a heat insulating plate 10 made of a material having a higher rigidity than that of the stud bump 7 is employed, not only the deformation of the heat insulating plate 10 due to pressure from the stud bump 7 is small upon contact bonding under heat but also generation of contact failure between the stud bump 7 and interconnect 2 can be prevented, because a large pressure can be applied to the stud bump 7 upon contact bonding under heat to cause its deformation and reduce the variations in the height of the stud bump 7.

By heating in the step of contact bonding under heat, an adhesive material constituting the adhesive layer 8 is hardened. To attain efficient heating, use of an insulating material having a low thermal conductivity for the heat insulating plate 10 is preferred. For example, materials such as glass and ceramic are preferred.

With regards to the tape substrate 3, a plurality of tape substrates 3 which will be a plurality of semiconductor devices are integrally formed as a strip-shaped sheet or a film wound on a reel. A block having a plurality of semiconductor devices is subjected to contact bonding under heat simultaneously. When the tap substrates 3 are formed as a strip-shaped sheet, one sheet can be subjected to contact bonding under heat as one block.

When a plurality of semiconductor devices are treated simultaneously, the number of the semiconductor devices which can be subjected to simultaneous treatment is limited because of misalignment or height error of the semiconductor chip 4. When a long film having a number of tape substrates 3 integrated therein is wound on a reel and then subjected to contact bonding under heat, the whole film cannot be treated as a single block.

The appropriate number of the tape substrate 3 of the long film is treated as a single block. Upon contact bonding under heat of a single block, when an uncured adhesive layer 8 is disposed in an untreated block adjacent to a treated block, heat generated upon the contact bonding under heat transfers to the adhesive layer 8 of the adjacent untreated block and this adhesive layer 8 is cured before treatment of this block. The adhesive layer in the untreated block is inevitably cured not under pressure, which makes it impossible to achieve contact conduction between the stud bump 7 and interconnect 2. In order to overcome the above-described problem, it is possible to have a sufficient space between two adjacent single blocks on a long film and thermally separate them each other. In this method, however, wasteful use of the film leads to a rise in the cost of products.

To avoid such a situation, the film is cut into sheet by block subjected to simultaneous treatment and two adjacent blocks are separated each other. This makes it possible to prevent the transfer of the heat to another block upon contact bonding under heat and at the same time, to reduce the cost owing to the efficient use of the film.

The tape substrate 3 has a larger planar shape than the semiconductor chip 4 because it needs a margin for dicing. The tape substrate 3 therefore overhangs, at the end portion thereof, by about 200 µm or less from the end portion of the semiconductor chip 4. When the adhesive layer 8 segmented to correspond to each semiconductor chip is used, the adhesive layer 8 is not sometimes laid over the end of the tape substrate 3 which has protruded from the end portion of the semiconductor chip 4. The present inventors have investigated a problem which possibly occurs by such a structure in a dicing step and as a result, found that the end of the interconnect turns outward from the tape substrate.

Figure 5:
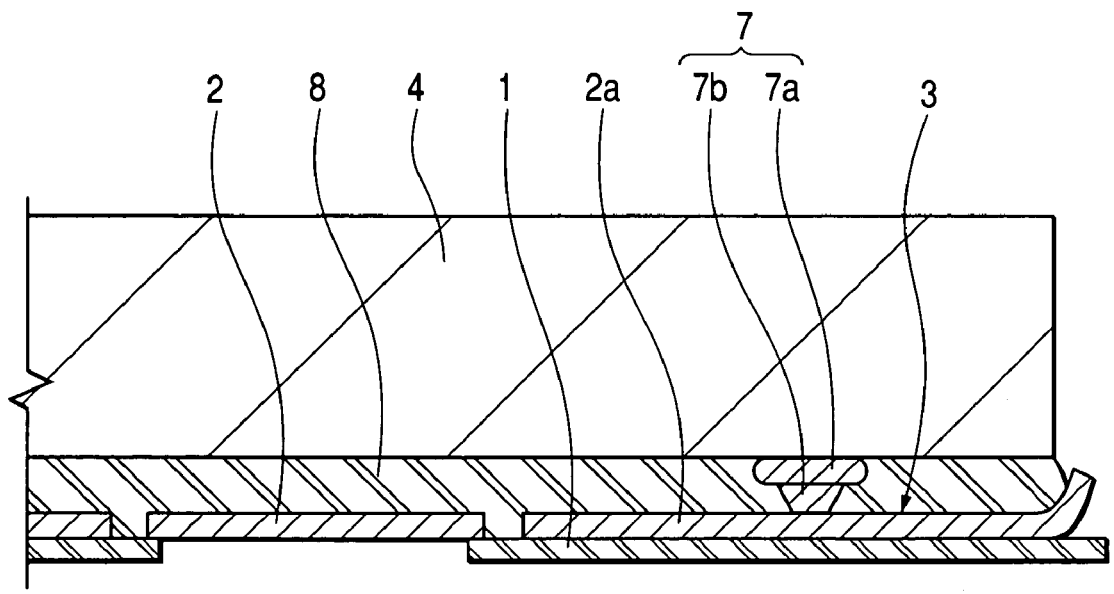
FIG. 5 is a fragmentary longitudinal cross-sectional view illustrating a manufacturing step of a semiconductor device of Comparative Example evaluated by the present inventors.

In this Embodiment, the interconnect on the main surface of the tape substrate 3 is not covered with an insulating film such as solder resist film so that the interconnect 2 is exposed at the end portion of the tape substrate 3. When, after mounting of the semiconductor chip 4 on the substrate, a sheet having a plurality of tape substrates 3 formed integral therein is cut and separated into each piece by dicing, the interconnect 2 peels and turns outward, at the end portion thereof, from the base 1 of the base substrate as illustrated in the fragmentary longitudinal cross-sectional view of FIG. 5 owing to a stress applied to the end portion of the interconnect 2 by friction with a turning dicing blade upon cutting of the interconnect 2 of the tape substrate 3. The end portion of the interconnect 2 which has thus turned outward happens to get in touch with the semiconductor chip 4 and cause a short-circuit failure.

Figure 6:
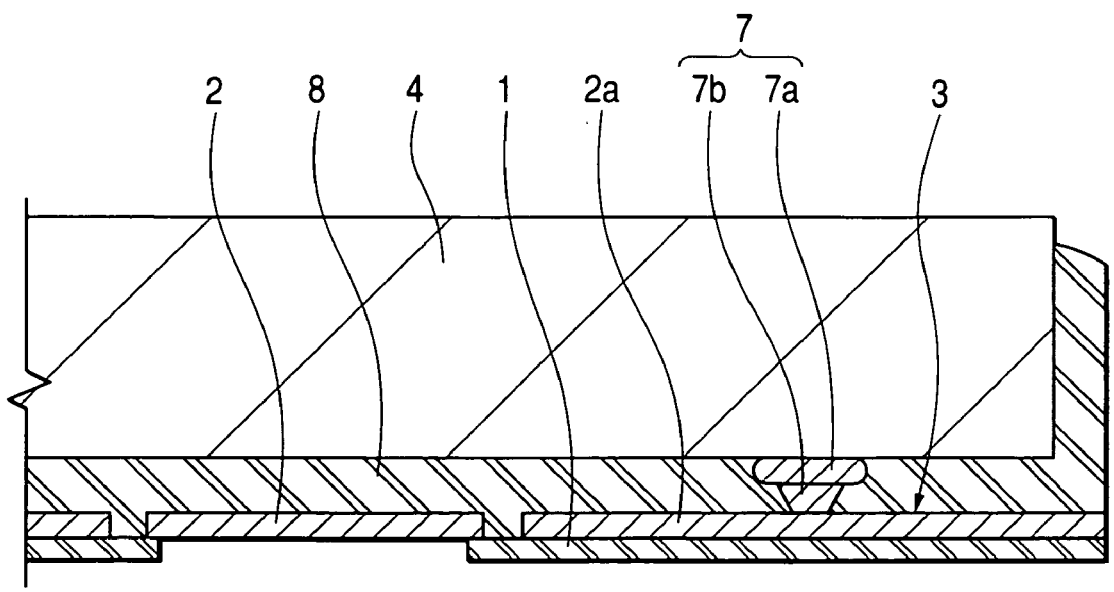
FIG. 6 is a fragmentary longitudinal cross-sectional view illustrating a manufacturing step of the semiconductor device according to the one embodiment of the present invention.

In the semiconductor device according to this Embodiment, occurrence of such a defect is prevented by forming the adhesive layer 8 all over the surface of the tape substrate 3, and covering the lead interconnect 2a at the end portion of the tape substrate 3 with the adhesive layer 8 as illustrated in FIG. 6. The adhesive layer 8 prevents the peeling of the end portion of the lead interconnect 2a from the base 1 by holding the end portion of the lead interconnect 2a tightly.

As described above, when the interconnect 2 of the tape substrate 3 is formed by electroplating, the lead interconnect 2a crossing over a dicing region of the tape substrate 3 becomes necessary for connecting between two adjacent interconnects 2 of the tape substrate 3. When the interconnect 2 is formed by electroless plating, on the other hand, the lead interconnect 2a is not required and the interconnect 2 can be formed independently for each tape substrate 3.

The lead interconnect 2a crossing over the dicing region becomes unnecessary so that by not disposing the interconnect 2 at the end portion of the tape substrate 3, it is possible to prevent the peeling of the interconnect 2 at the end portion of the tape substrate 3 which will otherwise occur associated with the rotation of the blade upon dicing. Moreover, the formation of the interconnect 2 by electroless plating offers the following advantage.

In semiconductor devices, size reduction of the semiconductor chip 4 and also high integration for increasing the number of circuits mounted thereon per area with an advance of miniaturization have been carried out. Semiconductor devices are therefore required to have many connection terminals for the increased number of circuits mounted under such a trend of increasing integration level. The number of bump electrodes 5 serving as external terminals of the semiconductor device is however limited, depending on the mounting conditions and it is sometimes difficult to dispose the bump electrodes 5 as much as pads 12 of the semiconductor chip 4.

Figure 7:
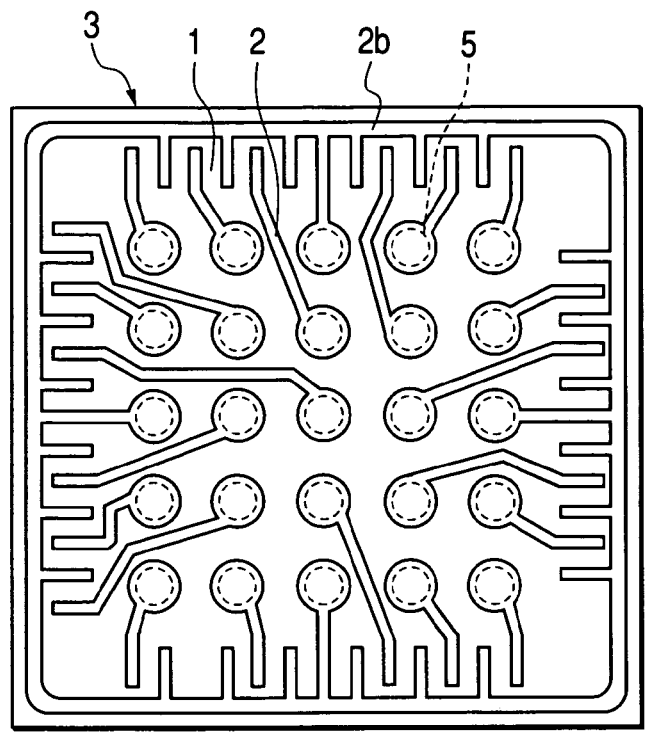
FIG. 7 is a plan view of a tape substrate used in the semiconductor device according to the one embodiment of the present invention.

In such a case, as illustrated in the chip mounting surface of the tape substrate 3 in FIG. 7, it is possible to reduce the number of external terminals by connecting external terminals common to a plurality of pads 12, which will serve, for example, power supply terminals, to a common interconnect 2b, and supplying power to the common interconnect 2b from the external terminals which are less in the number than the pad 12. In this example, the common interconnect 2b for supplying 28 pads 12 of the semiconductor chip 4 with the same potential are connected to 4 external terminals so that external terminals for 24 pads 12 can be reduced.

Figure 8:
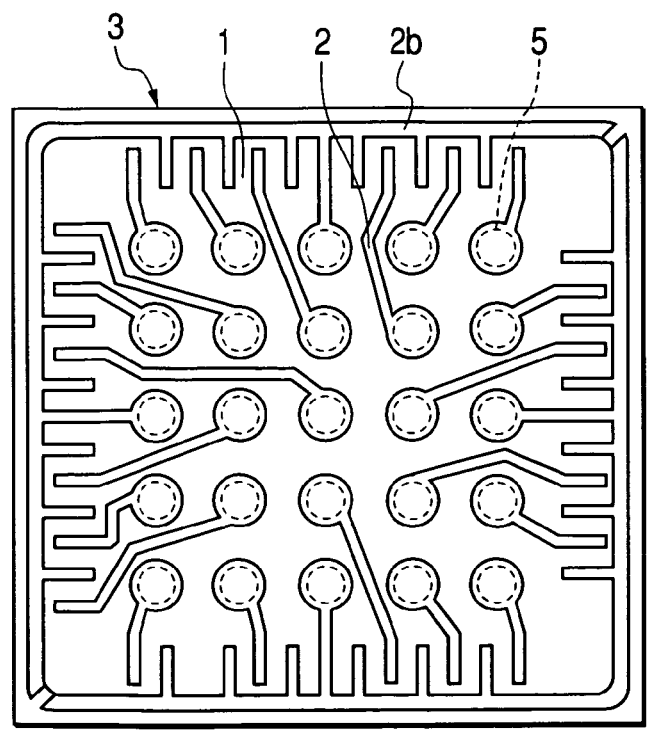
FIG. 8 is a plan view of a tape substrate used in the semiconductor device according to the one embodiment of the present invention.

Such a common interconnect 2b can be used in the form divided into two parts as illustrated in FIG. 8, for example, common interconnect 2b for supply potential and common interconnect 2b for ground potential. The common interconnect 2b can be divided further into three or four portions and cause to correspond to a plurality of supply potentials. Alternatively, the common interconnect 2b can be divided according to the using purpose, for example, into that corresponding to an analogue system and that corresponding to a digital system.

When the interconnect 2 is formed by electroplating, the lead interconnect 2a crossing over the peripheral portion of the tape substrate 3 becomes necessary in order to connect between the tape substrates 3 so that the common interconnect 2b along the periphery of the tape substrate 3 cannot be disposed. When the interconnect 2 is formed by electroless plating, on the other hand, the lead interconnect 2a is not necessary and therefore the common interconnect 2b can be disposed.

Figure 9:
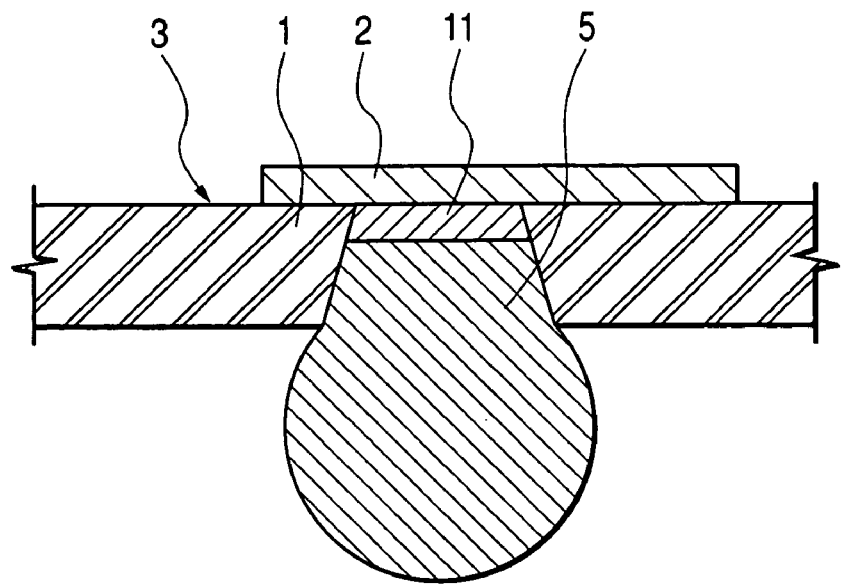
FIG. 9 is a fragmentary longitudinal cross-sectional view of a conventional semiconductor device.

The other end of the interconnect 2 of the tape substrate 3 on which the bump electrode 5 is to be formed is exposed from the mounting surface of the semiconductor device, that is, the other surface of the semiconductor device via a hole formed in the base 1 of the base substrate. As illustrated in the fragmentary longitudinal cross-sectional view of FIG. 9, the bump electrode 5 is connected to this exposed surface via a plated film 11, which has been formed, for example, by stacking gold over nickel for the purpose of reducing the contact resistance with a metal and accelerating reactivity of the solder.

When this bump electrode 5 and a mounting substrate are connected and they are thus in the packaged state, a thermal stress appears between the bump electrode 5 connected with the mounting substrate and the interconnect 2 of the tape substrate 3 owing to a difference in the thermal expansion coefficient between the semiconductor chip 4 and the mounting substrate to which the semiconductor chip 4 has been fixed, and this thermal stress causes peeling of the bump electrode 5 from the plated film 11, or the bump electrode 5 is sometimes cut by this thermal stress.

Figure 10:
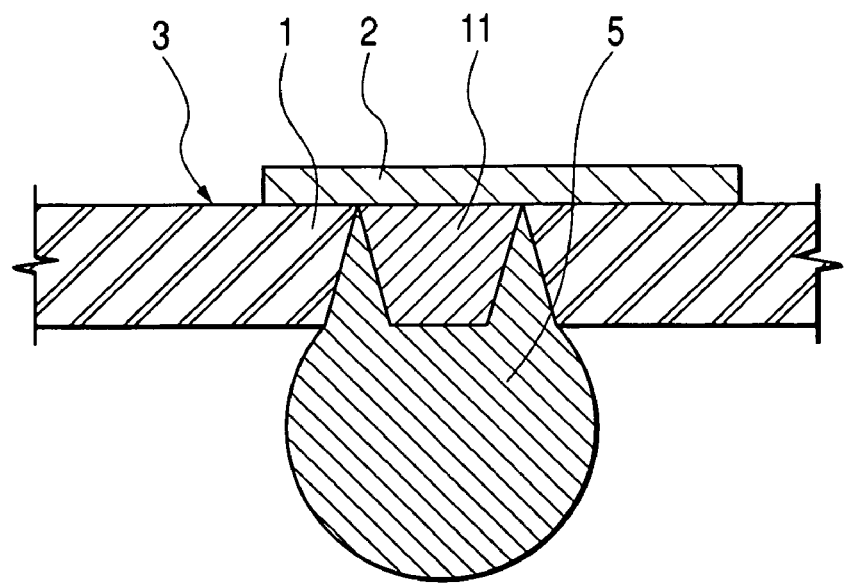
FIG. 10 is a fragmentary enlarged longitudinal cross-sectional view of the semiconductor device according to the one embodiment of the present invention.

In the semiconductor device illustrated in the fragmentary longitudinal cross-sectional view of FIG. 10, in order to prevent generation of such a defect, the stress between the bump electrode 5 connected with the mounting substrate and the interconnect 2 of the tape substrate 3 is relaxed by thickening the plated film 11. In this Embodiment, the thickness of the base 1 of the tape substrate 3 is 25 µm so that the plated film 11 usually formed to have a thickness of about 18 µm is increased to about 25 µm, a substantially equal thickness to the base 1.

Figure 11:
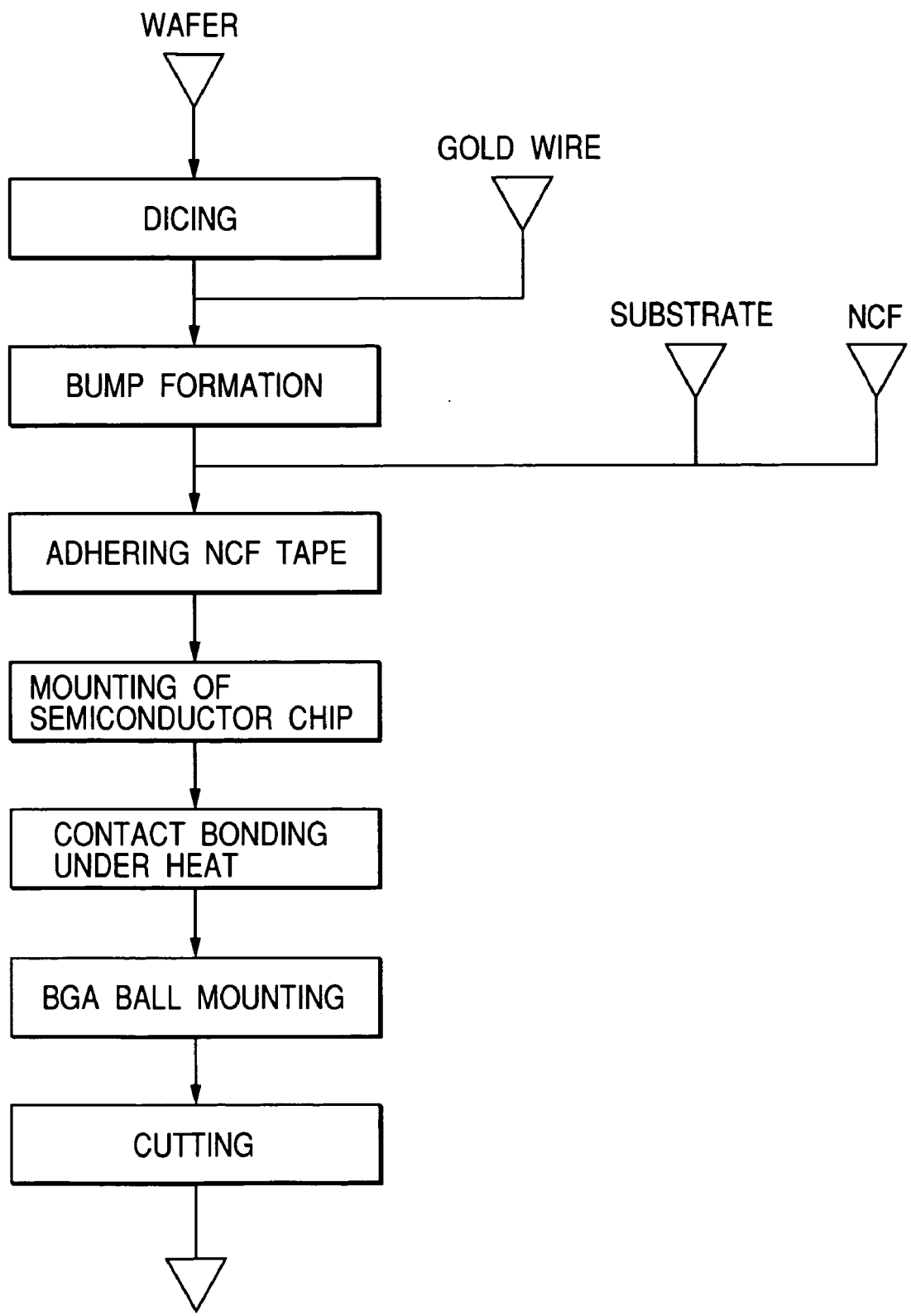
FIG. 11 is a flow chart for illustrating the manufacturing method of the semiconductor device according to the one embodiment of the present invention.

A manufacturing method of a semiconductor device using the tape substrate 3 illustrated in FIG. 7 will next be described based on the flow chart of FIG. 11 and the plan views and longitudinal cross-sectional views of FIG. 12 to FIG. 34 illustrating the respective manufacturing steps.

Figure 12:
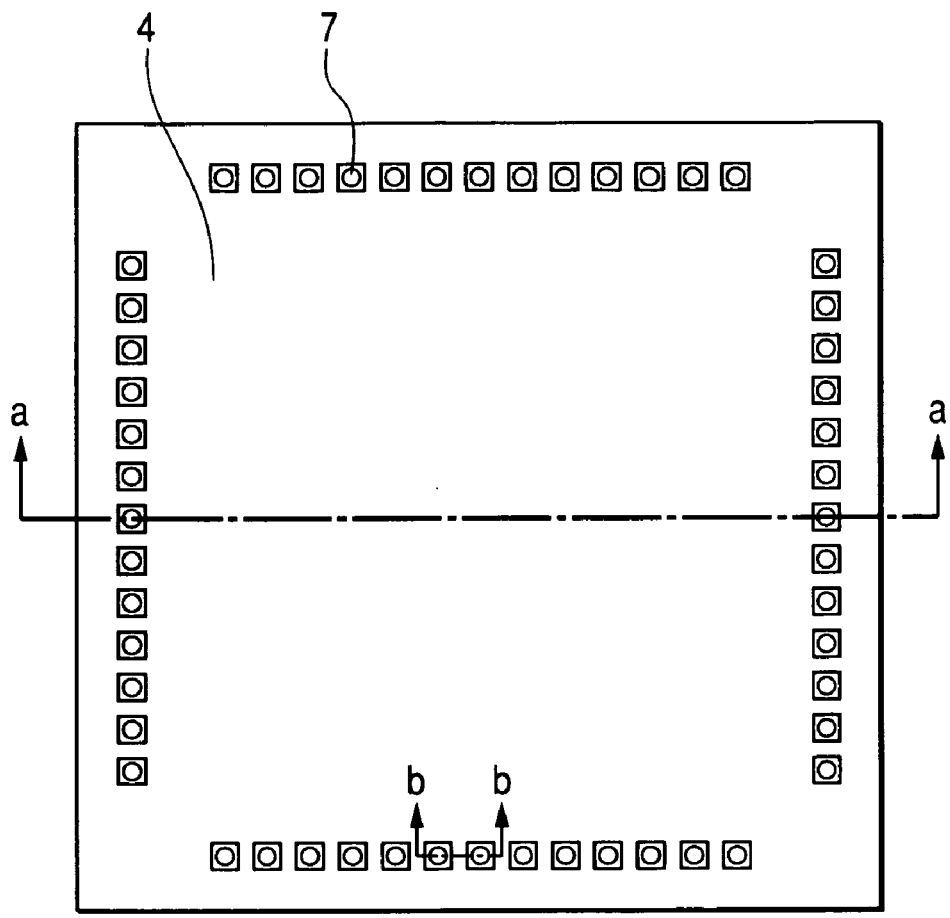
FIG. 12 is a plan view of a semiconductor chip having stud bumps formed thereon.
Figure 13:
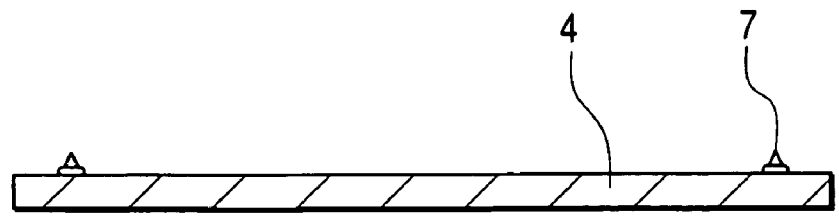
FIG. 13 is a longitudinal cross-sectional view taken along a line a—a of FIG. 12.
Figure 14:
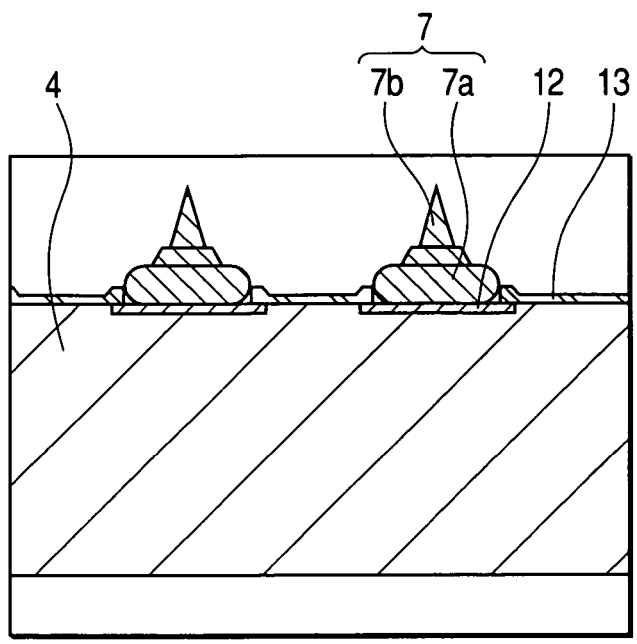
FIG. 14 is a fragmentary longitudinal cross-sectional view taken along a line b—b of FIG. 12.

FIG. 12 is a plan view of the semiconductor chip 4 having the stud bump 7 formed thereon, FIG. 13 is a longitudinal cross-sectional view taken along a line a—a of FIG. 12, and FIG. 14 is a fragmentary enlarged longitudinal cross-sectional view taken along a line b—b of FIG. 12.

This semiconductor chip 4 is manufactured by forming various elements on a semiconductor substrate made of, for example, single crystal silicon, and connecting these elements with an interconnect 2 formed over the semiconductor substrate and made of a metal film such as aluminum. In the forming steps of various elements and the interconnect 2, a series of treatments are added to a wafer having a matrix of a plurality of semiconductor chips 4 formed integrally thereon and in the dicing step after completion of the series of treatments, the wafer is cut vertically and horizontally into each semiconductor chip 4 by a dicing blade.

At the end portion of the uppermost level interconnect 2, a plurality of pads 12 are each exposed from an opening made in a protective insulating film 13. These pads 12 are each a square of about 60 μm to 90 μm and are disposed at a pitch of from about 70 μm to 100 μm. The pads 12 are formed in a line along the circumference of the semiconductor chip 4 and function as connection terminals between the semiconductor chip 4 and tape substrate 3. On each of these pads 12, a stud bump 7 is formed.

The stud bump 7 is formed of a spherical portion 7a which is fusion bonded to the pad 12 of the semiconductor chip 4 and a conical protruding portion 7b associated with this spherical portion 7a. With this protruding portion 7b in contact with the interconnect 2 of the tape substrate 3, the semiconductor chip 4 is fixed to the substrate by adhesion with an adhesive layer 8 (Non Conductive Film) which is a film adhesive, whereby contact conduction between the stud bump 7 and the interconnect 2 of the tape substrate 3 is achieved.

With regards to this stud bump 7, a gold wire having a diameter as fine as from about 20 μm to 30 μm and exposed from a wire bonder capillary is melted by using a discharge torch or the like. The molten gold becomes a sphere having a diameter of about 50 μm to 80 μm by surface tension. The spherical portion 7a is formed while the resulting gold ball is bonded onto the pad 12 of the semiconductor chip 4. When the capillary is detached without reeling out a wire, the spherical portion 7a is separated from the capillary and the protruding portion 7b is formed on the pad 12.

In this stud bump 7, the spherical portion 7a fusion bonded onto the pad 12 has a diameter of from about 60 μm to 90 μm and a height of about 70 μm. The conical protruding portion 7b is formed as the gold wire is drawn continuously from the spherical portion 7a upon detachment and the diameter of the wire therefore decreases gradually.

Figure 15:
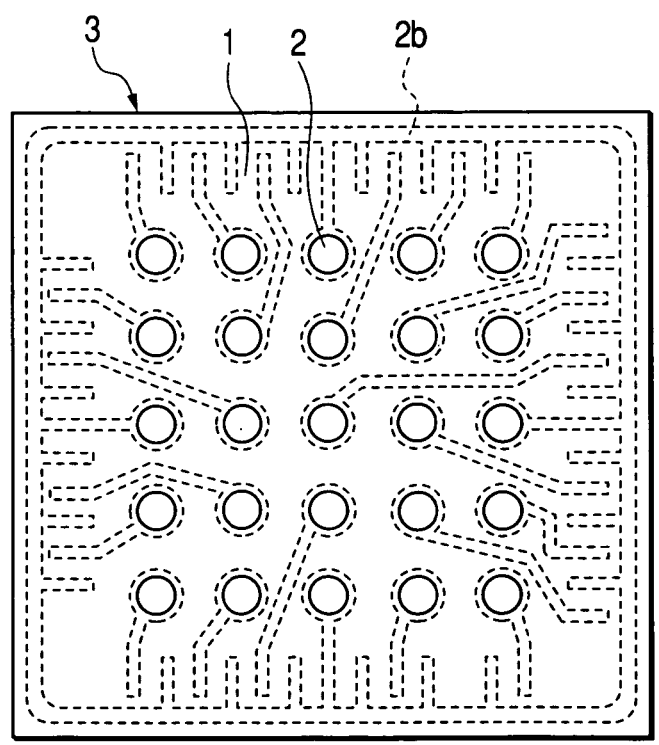
FIG. 15 is a bottom view of the tape substrate illustrated in FIG. 7.
Figure 16:
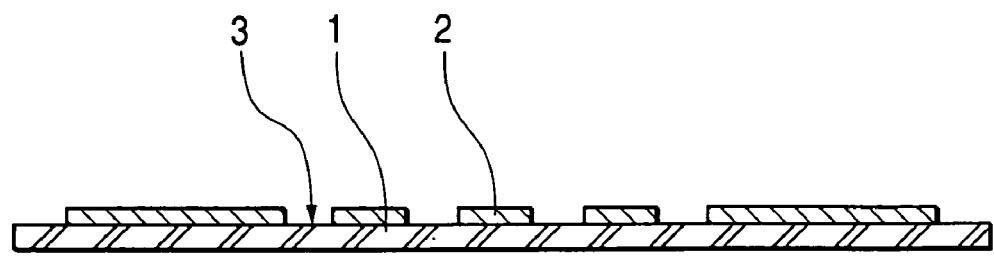
FIG. 16 is a longitudinal cross-sectional view of the tape substrate illustrated in FIG. 7.
Figure 17:
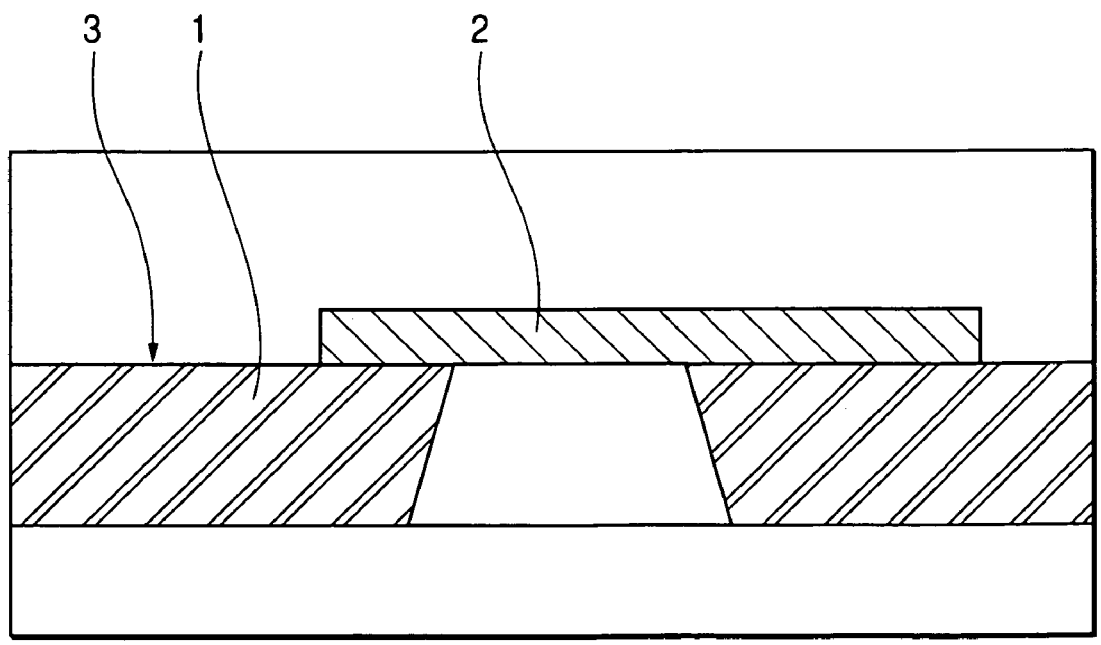
FIG. 17 is a fragmentary enlarged longitudinal cross-sectional view of the tape substrate illustrated in FIG. 7.

FIG. 15 is a bottom view of the other side of the tape substrate 3, which is a mounting surface, illustrated in FIG. 7; FIG. 16 is a longitudinal cross-sectional view of FIG. 15; and FIG. 17 is a fragmentary enlarged longitudinal cross-sectional view of FIG. 15. The other end of the interconnect 2 formed on the tape substrate 3 is exposed from the mounting surface via a hole made in the base 1 of the base substrate 1. On this exposed surface, a plated film 11 is formed by stacking, for example, gold over nickel for the purpose of reducing the contact resistance of the metal and accelerating reactivity of a solder. A bump electrode 5 is connected to this plated film 11.

Figure 18:
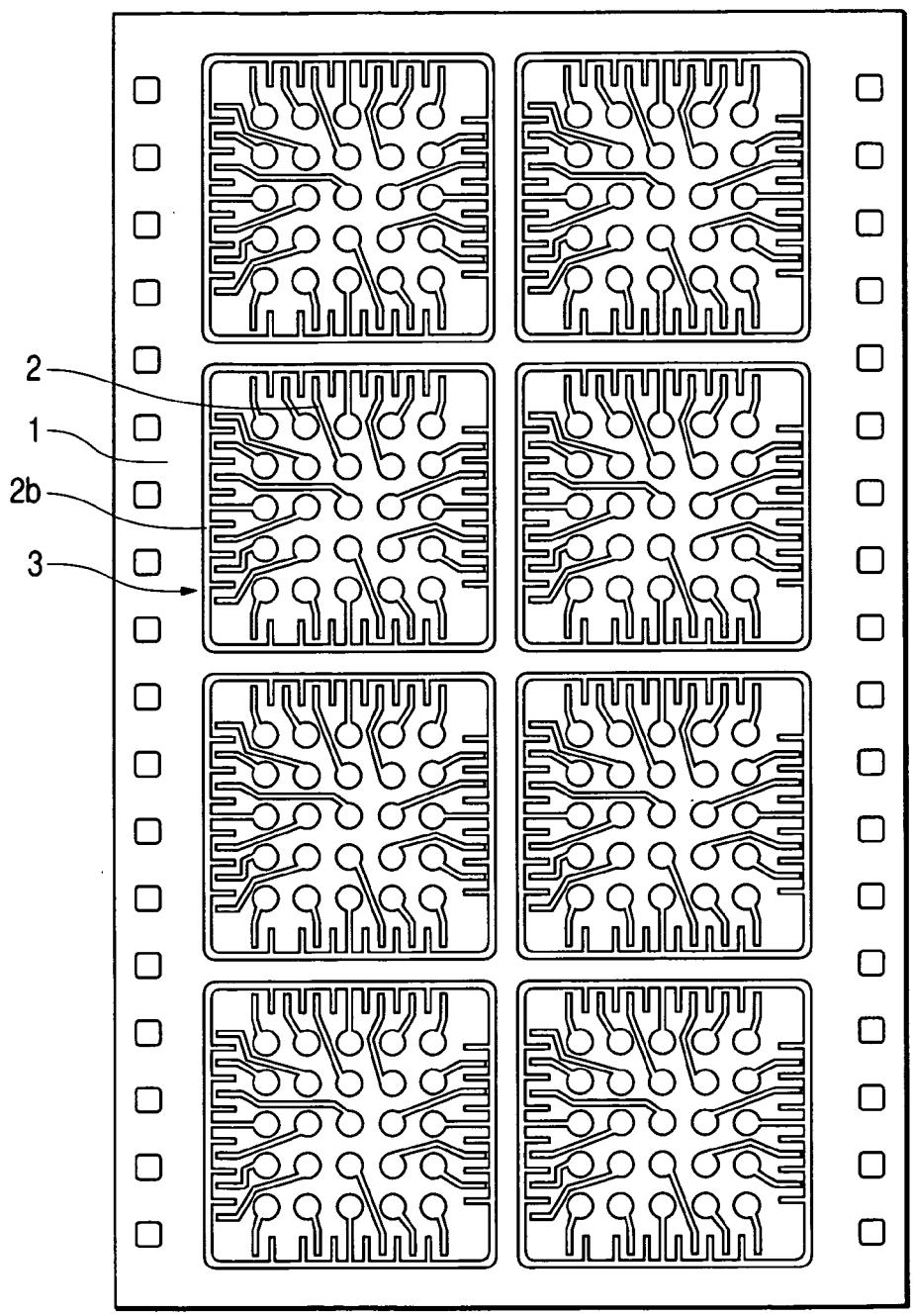
FIG. 18 is a plan view of a sheet having, integrated therein, a plurality of the tape substrates illustrated in FIG. 7.
Figure 19:
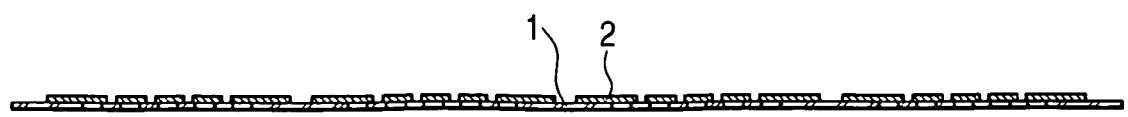
FIG. 19 is a longitudinal cross-sectional view of a sheet having, integrated therein, a plurality of the tape substrates illustrated in FIG. 7.

As illustrated in the plan view of FIG. 18 and its longitudinal cross-sectional view of FIG. 19, the tape substrate 3 of this Embodiment is a strip-shaped sheet having a matrix of the tape substrates 3 corresponding to 8 semiconductor devices integrally formed. In each tape substrate 3, an interconnect 2 made of a metal film such as copper is formed over a base 1 made of an insulating resin such as polyimide and a semiconductor chip 4 is connected to one end of the interconnect 2 formed on the tape substrate 3 and a bump electrode 5 is connected to the other end.

Figure 20:
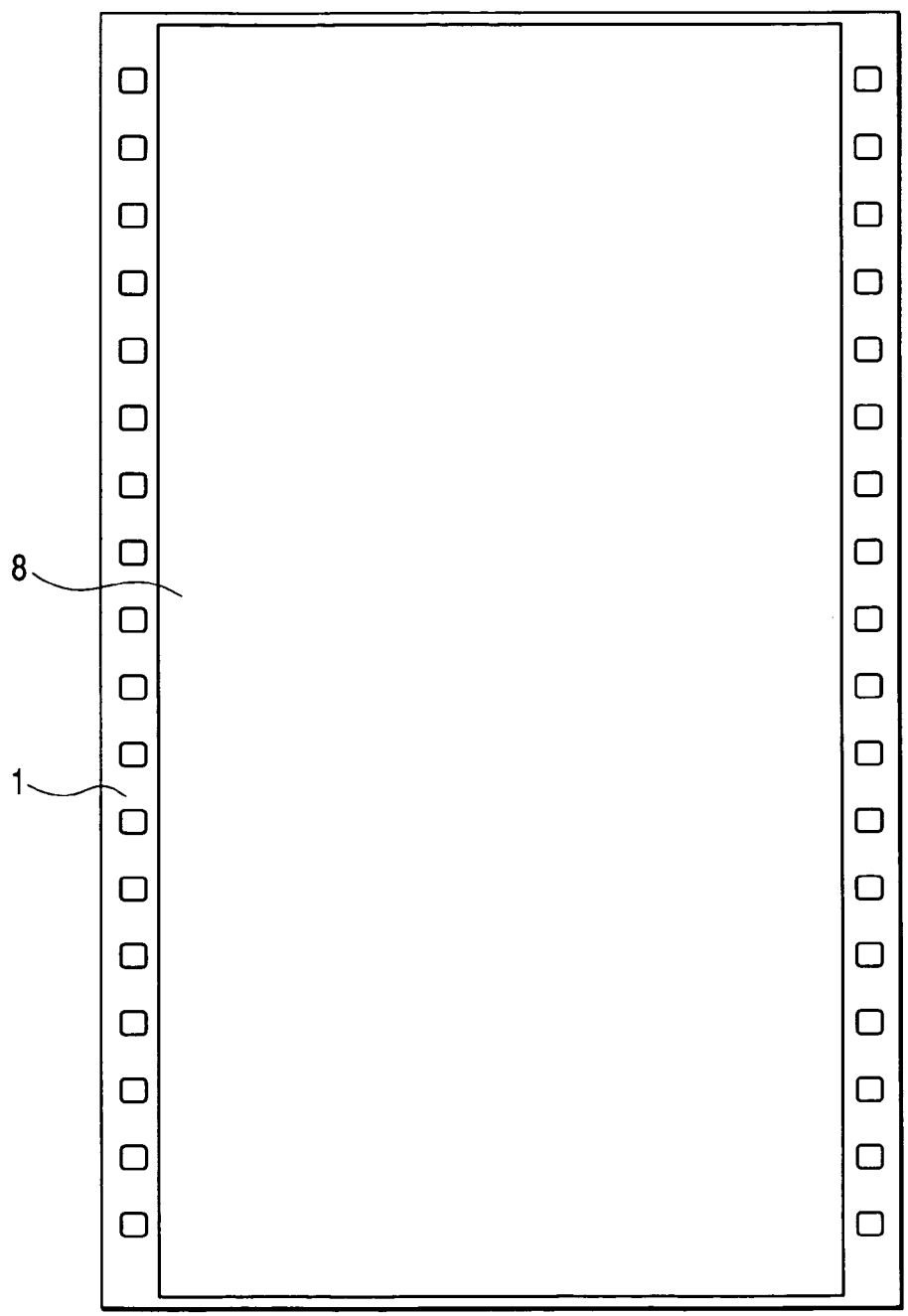
FIG. 20 is a plan view illustrating a step of the manufacturing method of the semiconductor device according to the one embodiment of the present invention.
Figure 21:
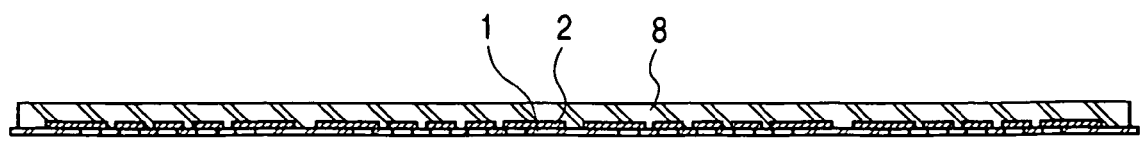
FIG. 21 is a longitudinal cross-sectional view illustrating a step of the manufacturing method of the semiconductor device according to the one embodiment of the present invention.

As illustrated in the plan view of FIG. 20 and its longitudinal cross-sectional view of FIG. 21, an adhesive layer 8 is attached to the surface of the sheet on which the semiconductor chip 4 is to be mounted. The adhesive layer 8 of the conventional semiconductor device is formed corresponding to the semiconductor chip 4 so that it is adhered to the semiconductor device after separated into each piece. In this Embodiment, on the other hand, the adhesive layer 8 is attached to the sheet without being separated into pieces so as to straddle a plurality of the chip mounting surfaces, whereby the end portion of the tape substrate 3 is covered with the adhesive layer 8.

Figure 22:
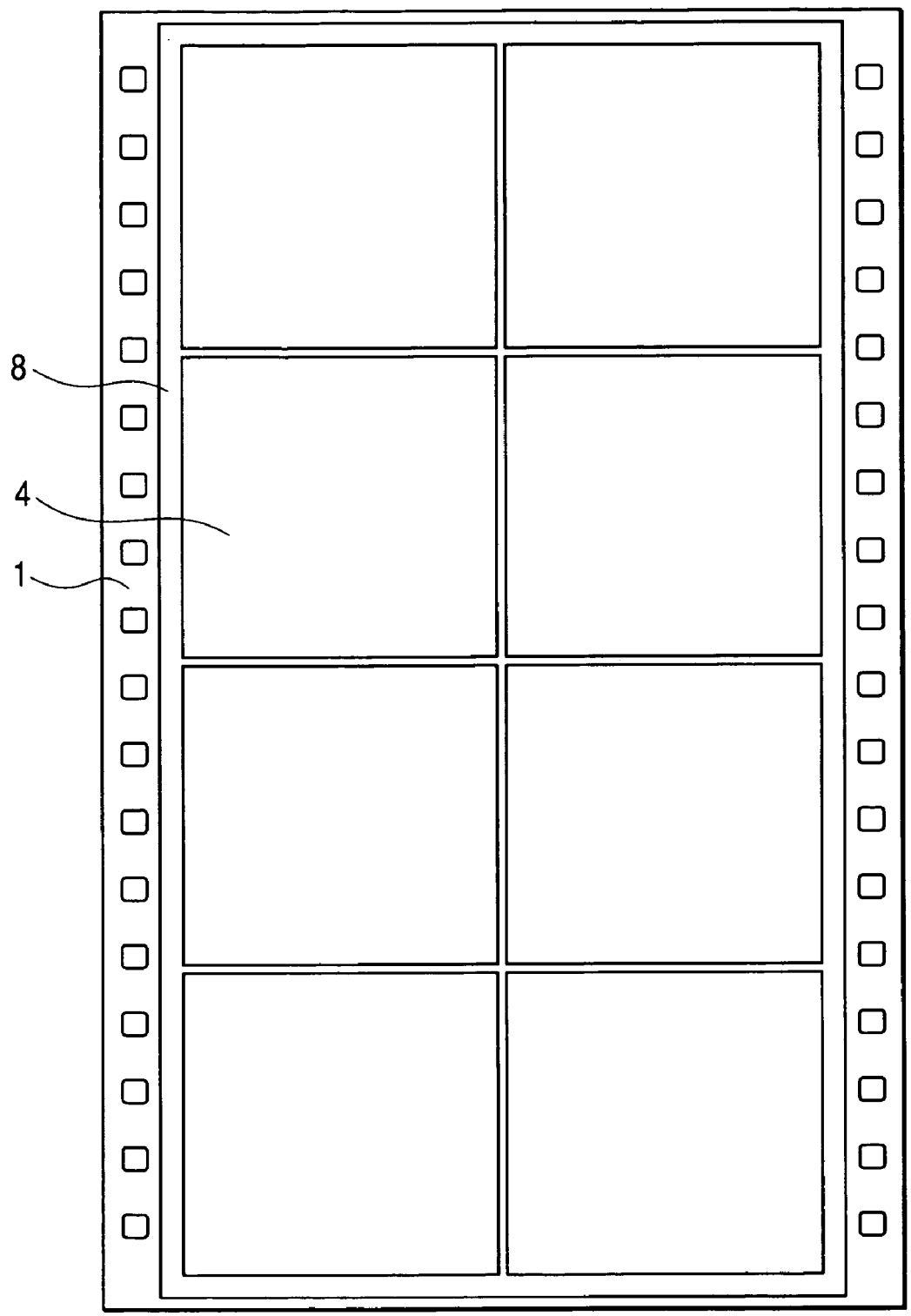
FIG. 22 is a plan view illustrating a step of the manufacturing method of the semiconductor device according to the one embodiment of the present invention.
Figure 23:
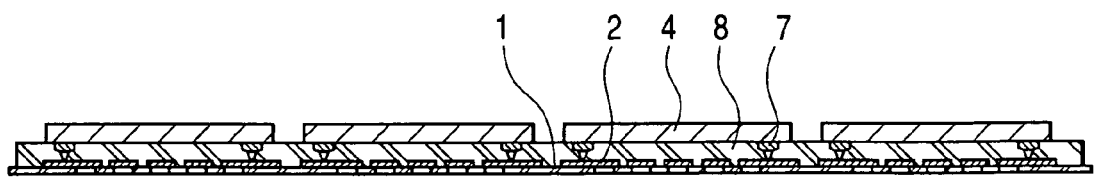
FIG. 23 is a longitudinal cross-sectional view illustrating a step of the manufacturing method of the semiconductor device according to the one embodiment of the present invention.

As illustrated in the plan view of FIG. 22 and its longitudinal cross-sectional view of FIG. 23, the semiconductor chip 4 is tentatively mounted on the tape substrate 3 by placing the semiconductor chip 4 at a predetermined position of the tape substrate 3 of the sheet to which the adhesive layer 8 has been attached and then pushing.

Figure 24:
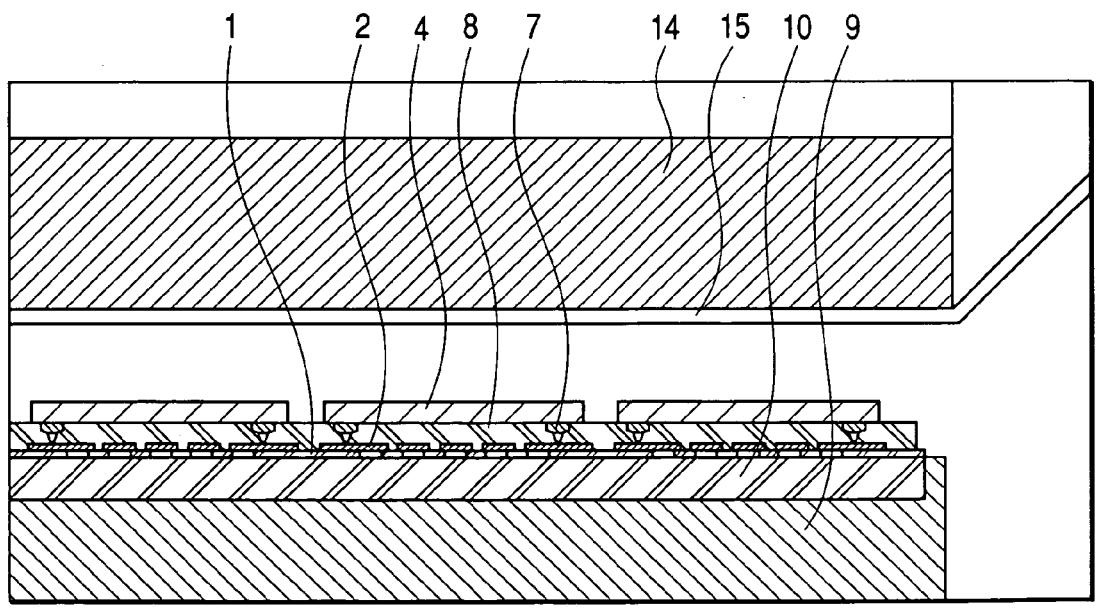
FIG. 24 is a fragmentary enlarged longitudinal cross-sectional view illustrating a step of the manufacturing method of the semiconductor device according to the one embodiment of the present invention.
Figure 25:
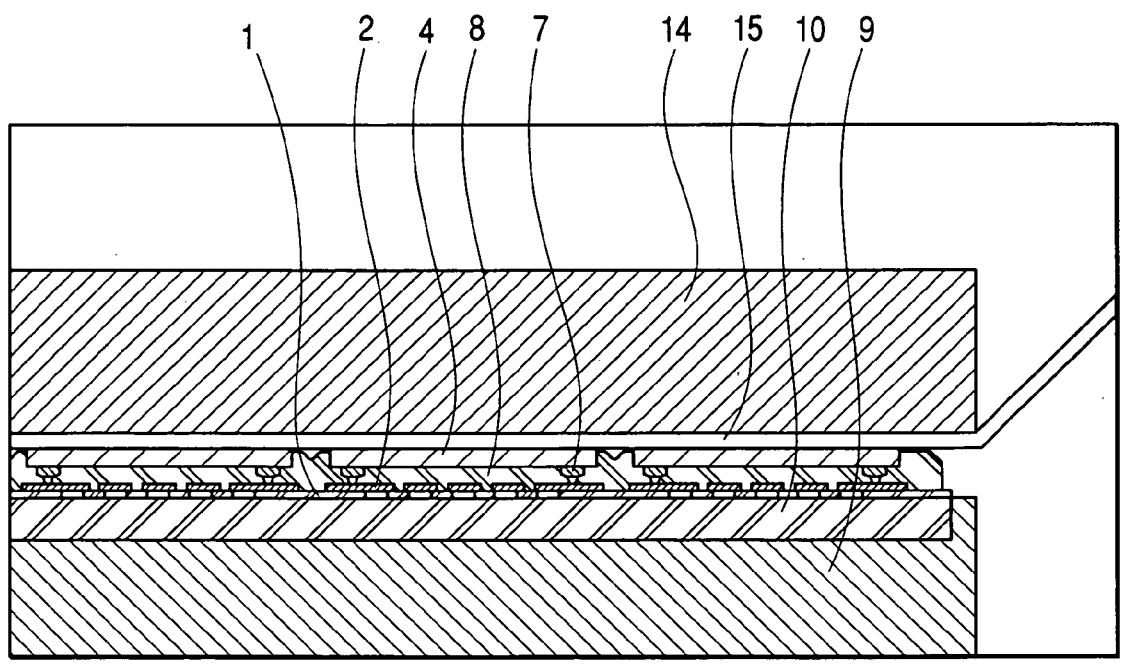
FIG. 25 is a fragmentary enlarged longitudinal cross-sectional view illustrating a step of the manufacturing method of the semiconductor device according to the one embodiment of the present invention.

As illustrated in the longitudinal cross-sectional view of FIG. 24, the sheet of the tape substrate 4 on which the semiconductor chip 4 has been mounted is fixed to a table 9 of a thermocompression bonder, placing a heat block 14 opposite to the table 9, lowering the heat block 14 as illustrated in the longitudinal cross-sectional view of FIG. 25, heating the adhesive layer 8 while pushing the semiconductor chip 4, and applying a predetermined temperature and pressure to the adhesive layer 8 to harden the adhesive layer 8 under pressure state. The adhesive layer 8 is hardened under pressure so that the semiconductor chip 4 is fixed to the tape substrate 3 with the stud bump 7 of the semiconductor chip 4 being brought into contact with the interconnect 2 of the tape substrate 3.

Upon this contact bonding under heat, the surface of the table 9 is covered with a rigid heat insulating plate 10 made of glass or ceramic in order to prevent diffusion of applied heat. This rigid heat insulating plate 10 can prevent heat diffusion and at the same time, the deformation of the tape substrate 3. The heat block 14 has a surface covered with a protective sheet 15 to prevent it from adhering to the adhesive layer 8.

Figure 26:
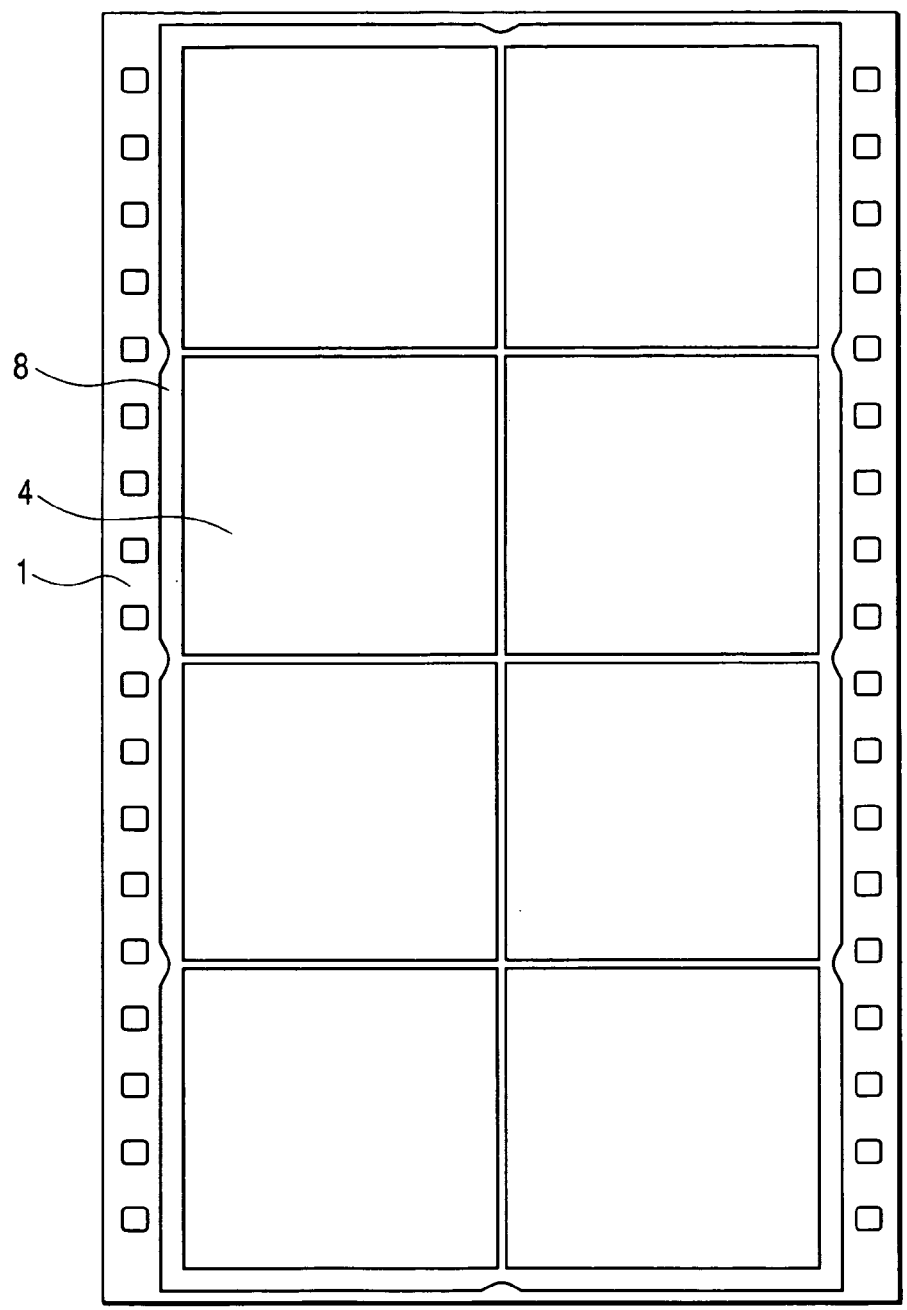
FIG. 26 is a plan view illustrating a step of the manufacturing method of the semiconductor device according to the one embodiment of the present invention.
Figure 27:
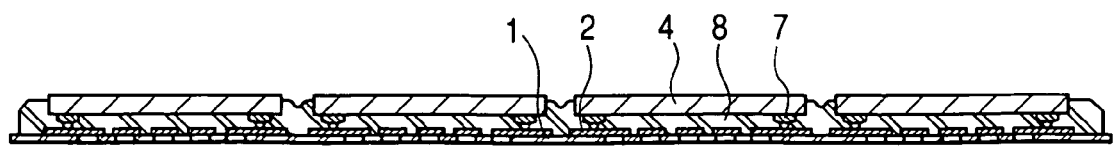
FIG. 27 is a longitudinal cross-sectional view illustrating a step of the manufacturing method of the semiconductor device according to the one embodiment of the present invention.

FIGS. 26 and 27 are plan view and longitudinal cross-sectional views illustrating the sheet and semiconductor chip after contact bonding under heat. The adhesive layer 8 has changed its shape by pressure upon thermosetting. Below the surface of the semiconductor chip 4, its thickness decreases. A melted portion of the adhesive layer 8 flows between the semiconductor chips 4 and raises the thickness of adhesive layer 8 between the semiconductor chips 4 to cover the side surface thereof. When the lead interconnect 2a is disposed at the end portion of the tape substrate 3, the adhesive layer 8 can effectively prevent the peeling of the lead interconnect 2a by this increase in the thickness of the adhesive layer 8.

Figure 28:
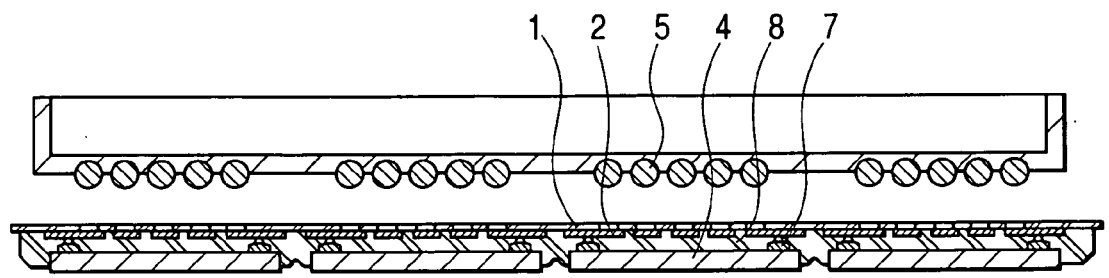
FIG. 28 is a longitudinal cross-sectional view illustrating a step of the manufacturing method of the semiconductor device according to the one embodiment of the present invention.
Figure 29:
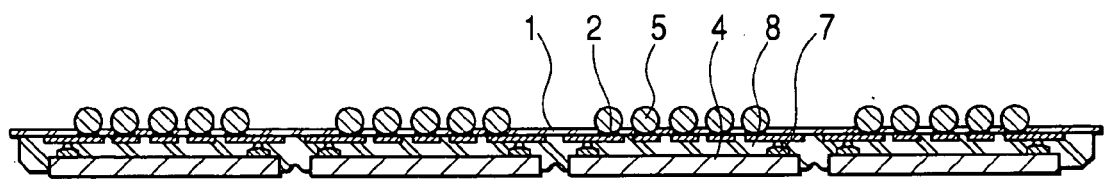
FIG. 29 is a longitudinal cross-sectional view illustrating a step of the manufacturing method of the semiconductor device according to the one embodiment of the present invention.
Figure 30:
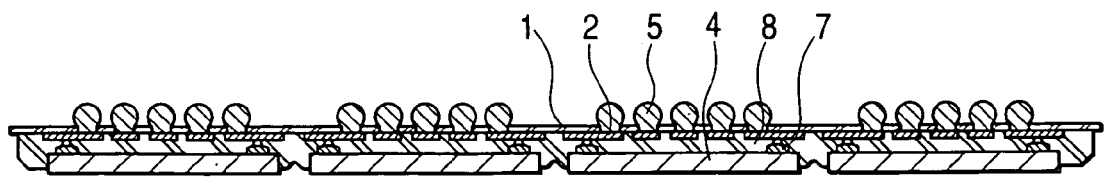
FIG. 30 is a longitudinal cross-sectional view illustrating a step of the manufacturing method of the semiconductor device according to the one embodiment of the present invention.
Figure 31:
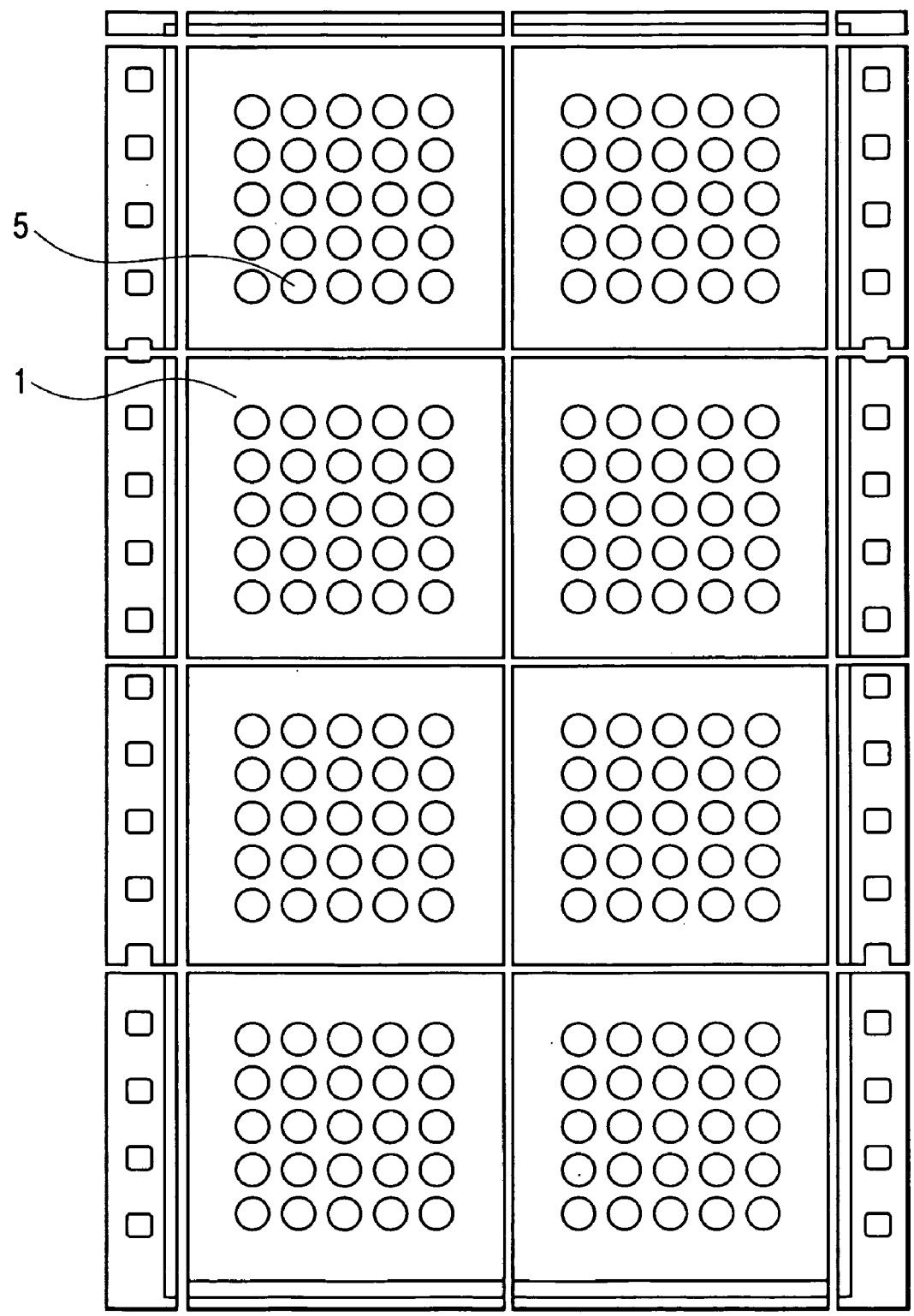
FIG. 31 is a plan view illustrating a step of the manufacturing method of the semiconductor device according to the one embodiment of the present invention.
Figure 32:
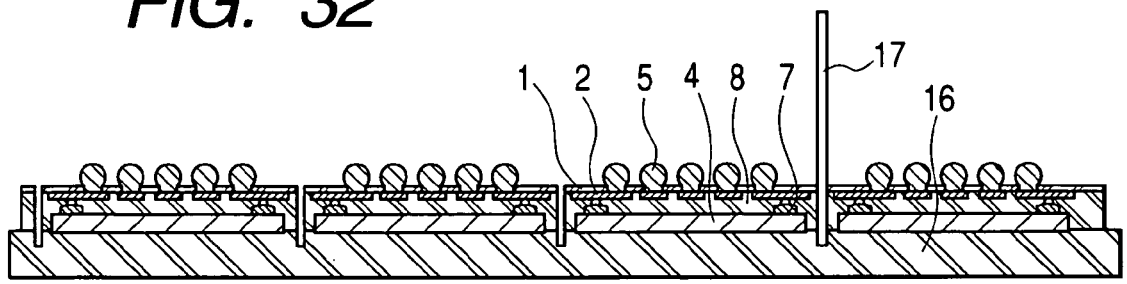
FIG. 32 is a longitudinal cross-sectional view illustrating a step of the manufacturing method of the semiconductor device according to the one embodiment of the present invention.
Figure 33:
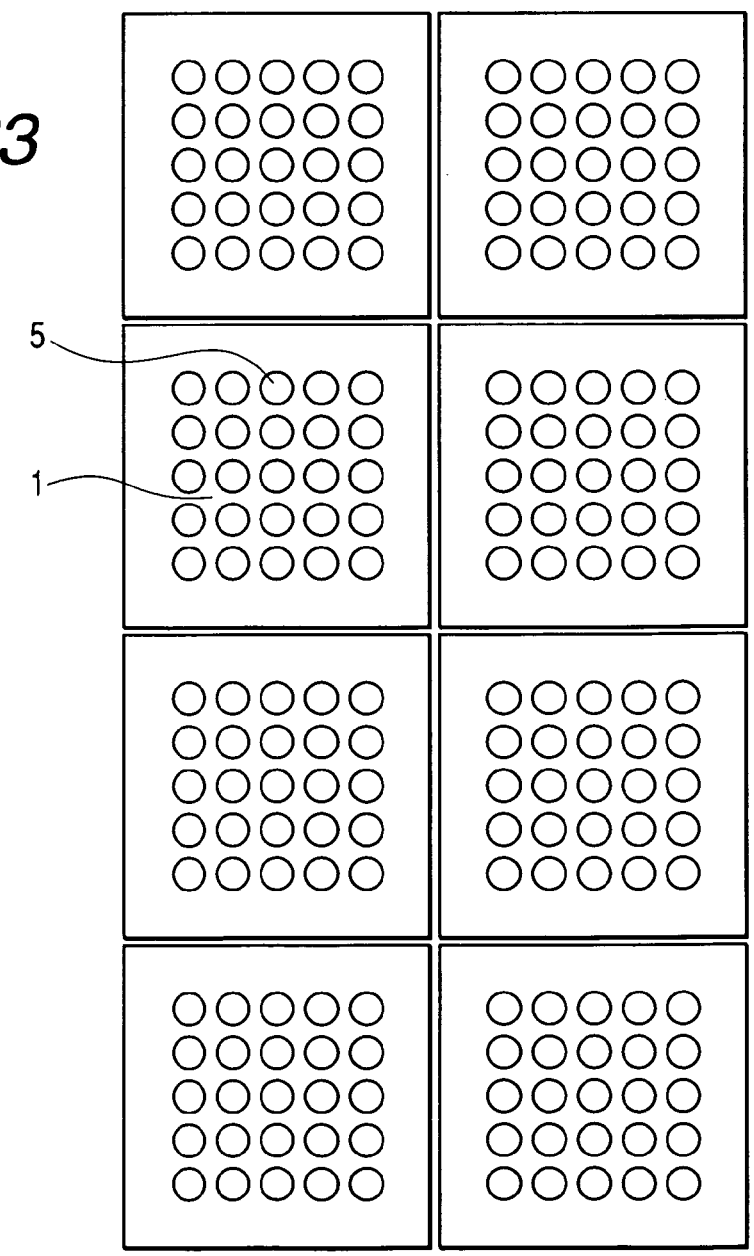
FIG. 33 is a plan view illustrating a step of the manufacturing method of the semiconductor device according to the one embodiment of the present invention.
Figure 34:
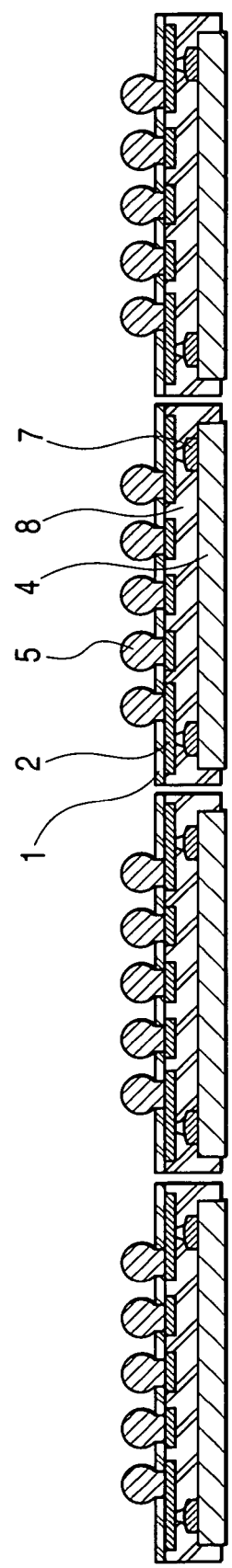
FIG. 34 is a longitudinal cross-sectional view illustrating a step of the manufacturing method of the semiconductor device according to the one embodiment of the present invention.

As illustrated in the longitudinal cross-sectional view of FIG. 28, a solder-ball mounting tool having solder balls 5' of 400 µm in diameter attached thereto is placed opposite to the tape substrate 3 in such a manner as to make solder balls 5' correspond to the bump electrodes 5, respectively. As illustrated in FIG. 29, after the solder balls 5' are brought into contact with the plated film 11 of the tape substrate 3 and are melted and solidified by reflow heating, bump electrodes 5 fixed to the plated film 11 and having a diameter of about 450 µm and height of about 400 µm are formed at a pitch of from about 150 µm to 500 µm as illustrated in FIG. 30. These bump electrodes 5 serve as external terminals of the semiconductor device.

The tape substrate 3 and adhesive layer 8 are then diced. As illustrated in the plan view of FIG. 31 and its longitudinal cross-sectional view of FIG. 32, the tape substrate 3 is fixed to a dicing tape 16 while having the semiconductor chip 4 attached to the dicing tape 16, and then, the tape substrate 3 and adhesive layer 8 in the dicing region are cut vertically and horizontally by a dicing blade 17. As illustrated in the plan view of FIG. 33 and its longitudinal cross-sectional view of FIG. 34, when the dicing tape 16 is removed by peeling, the tape substrates 3 formed integral as a sheet are separated and the respective semiconductor device segments are formed.

The present invention was so far described specifically based on some embodiments. The present invention is not limited to these embodiments. It is needless to say that it can be modified within an extent not departing from the scope of the present invention.

In the above-described embodiments, disclosed is the use of the stud bump 7 as a protruding electrode formed over the pad 12 of the semiconductor chip 4. The shape and forming method of the protruding electrode are not limited to those disclosed in these embodiments. For example, a gold bump electrode formed by electroplating may be used.

Advantages of the typical inventions, of the inventions disclosed by the present application, will next be described briefly.

(1) According to the present invention, formation of a multistage stud bump is advantageous for maintaining a sufficient height of the stud bump 7 without widening the diameter thereof.

(2) According to the present invention, the above-described advantage (1) makes it possible to thicken the adhesive layer, cause the thickened adhesive layer to absorb the stress, and to prevent deformation of a semiconductor chip.

(3) According to the present invention, by thinning the adhesive layer and lowering the stud bump and thereby, decreasing the deformation amount of the stud bump, the connection reliability between the stud bump and interconnect can be improved.

(4) According to the present invention, by carrying out contact bonding under heat while having the tape substrate on a rigid heat insulating plate, deformation of the tape substrate upon contact bonding under heat can be prevented.

(5) According to the present invention, the adhesive layer covering therewith the lead interconnect at the end portion of the tape substrate is effective for holding the end portion of the lead interconnect firmly and preventing the end portion of the lead interconnect from peeling from the base.

(6) According to the present invention, connection of external terminals, which are each common to a plurality of pads, to a common interconnect is effective for reducing the number of external terminals.

(7) According to the present invention, thickening of the pad formed at the end portion of the interconnect is effective for relaxing the stress formed between the bump electrode connected to a mounting substrate and the interconnect of the tape substrate.

What is claimed is:

1. A semiconductor device having a semiconductor chip mounted over a substrate in which an interconnect is formed, by using an adhesive layer to connect a stud bump of the semiconductor chip to one end of the interconnect and an external terminal of the semiconductor device to the other end of the interconnect, wherein a common interconnect is disposed along the periphery of the substrate and the number of the stud bump to be connected to the common interconnect is greater than that of the external terminal to be connected to the common interconnect.

2. A semiconductor device having a semiconductor chip mounted over a substrate in which an interconnect is formed, by using an adhesive layer to connect a stud bump of the semiconductor chip to one end of the interconnect and an external terminal of the semiconductor device to the other end of the interconnect, wherein a bump electrode which will be an external terminal is formed, via a pad, at the other end of the interconnect, and wherein the pad is formed to have a substantially equal thickness to that of a base of the substrate.

\* \* \* \* \*